United States Patent
Adiga et al.

(10) Patent No.: US 12,048,254 B2
(45) Date of Patent: Jul. 23, 2024

(54) SACRIFICIAL MATERIAL FACILITATING PROTECTION OF A SUBSTRATE IN A QUBIT DEVICE

(71) Applicant: International Business Machines Corporation, Armonk, NY (US)

(72) Inventors: Vivekananda P. Adiga, Ossining, NY (US); Martin O. Sandberg, Ossining, NY (US); Jeng-Bang Yau, Yorktown Heights, NY (US); David L. Rath, Stormville, NY (US); John Bruley, Poughkeepsie, NY (US); Cihan Kurter, White Plains, NY (US); Kenneth P. Rodbell, Sandy Hook, CT (US); Hongwen Yan, Somers, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/071,528

(22) Filed: Oct. 15, 2020

(65) Prior Publication Data
US 2022/0123195 A1 Apr. 21, 2022

(51) Int. Cl.
*H10N 60/01* (2023.01)
*H10N 60/80* (2023.01)
*H10N 60/83* (2023.01)
*H10N 60/85* (2023.01)

(52) U.S. Cl.
CPC ....... *H10N 60/0912* (2023.02); *H10N 60/805* (2023.02); *H10N 60/83* (2023.02); *H10N 60/85* (2023.02)

(58) Field of Classification Search
CPC ... H01L 39/2493; H01L 39/025; H01L 39/08; H01L 39/12; H01L 39/223
See application file for complete search history.

(56) References Cited

U.S. PATENT DOCUMENTS

| 10,008,655 | B2 | 6/2018 | Chang et al. | |
|---|---|---|---|---|
| 2018/0138389 | A1* | 5/2018 | Kirby | H10N 60/0156 |
| 2019/0067787 | A1 | 2/2019 | Chang et al. | |
| 2019/0288176 | A1 | 9/2019 | Yoscovits et al. | |
| 2022/0102614 | A1* | 3/2022 | Copel | H10N 60/0128 |

FOREIGN PATENT DOCUMENTS

WO WO2019032115 * 2/2019

OTHER PUBLICATIONS

Han et al."Collapse of superconductivity in a hybrid tin-graphene Josephson junction array," arXiv:1402.1996 (Year: 2014).*

(Continued)

*Primary Examiner* — Matthew L Reames
(74) *Attorney, Agent, or Firm* — Erik Johnson

(57) ABSTRACT

Devices, systems, methods, and/or computer-implemented methods that can facilitate protection of a substrate in a qubit device using sacrificial material are provided. According to an embodiment, a device can comprise a superconducting lead provided on a pillar of a sacrificial material provided on a substrate. The device can further comprise a collapsed superconducting junction provided on the substrate and coupled to the superconducting lead.

9 Claims, 16 Drawing Sheets

(56) References Cited

OTHER PUBLICATIONS

Chu et al., "Suspending superconducting qubits by silicon micromachining," Appl. Phys. Lett. 109, arXiv:1606.02822v1 [quant-ph], Jun. 9, 2016, 10 pages.

Oh et al., "Elimination of two level fluctuators in superconducting quantum bits by an epitaxial tunnel barrier," Physical Review B 74, http://dx.doi.org/10.1103/PhysRevB.74.100502, 2006, 4 pages.

* cited by examiner

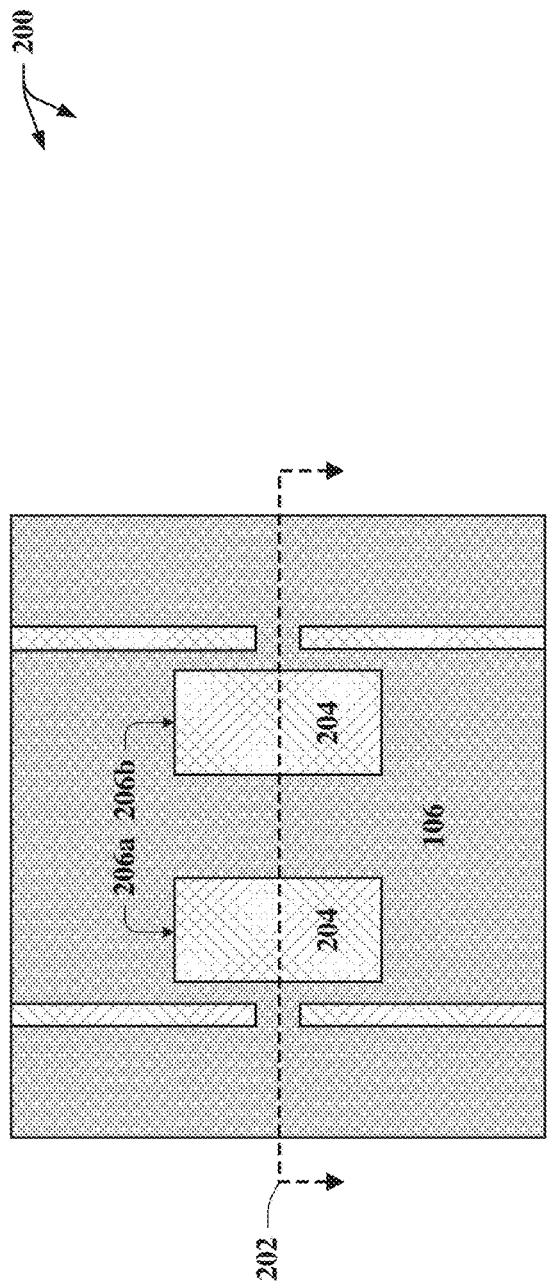
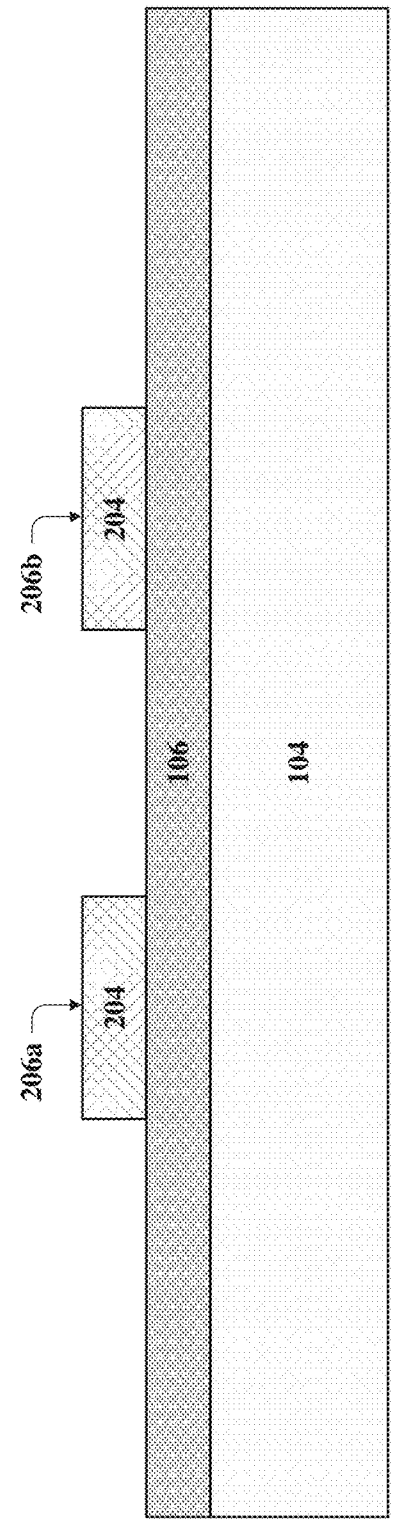
FIG. 2A
FIG. 2B

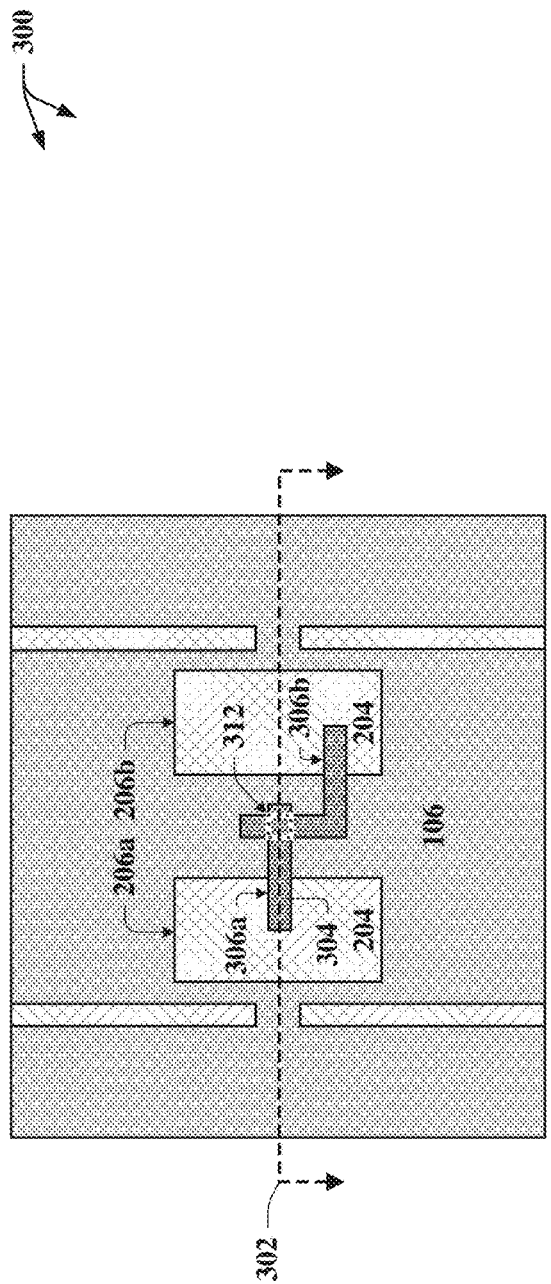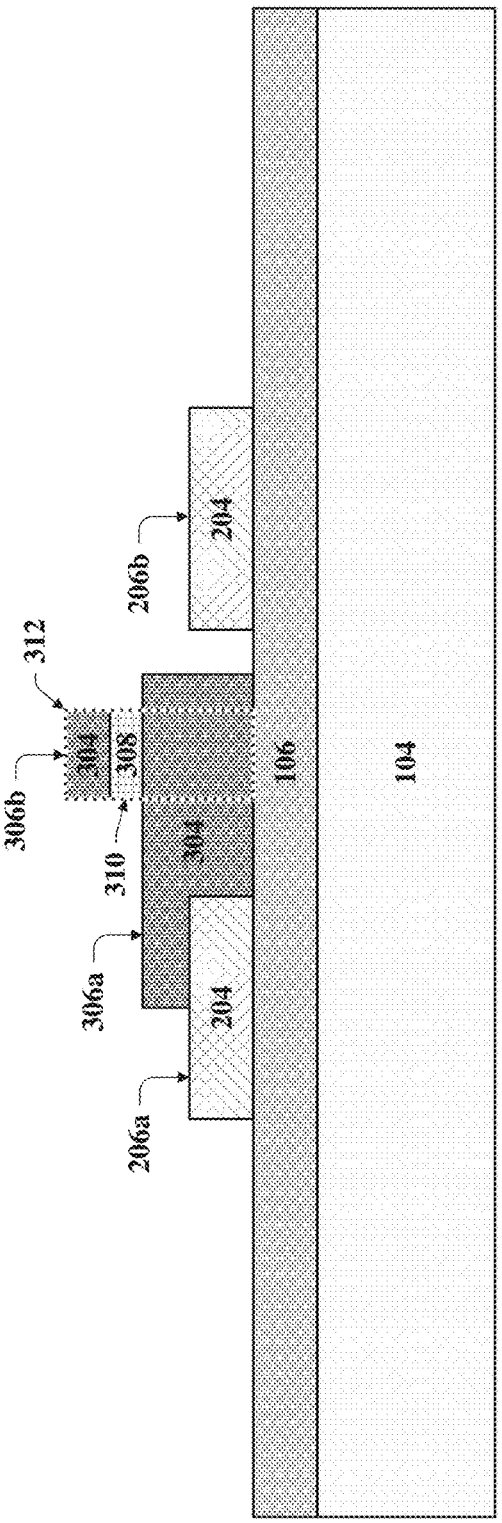
FIG. 3A
FIG. 3B

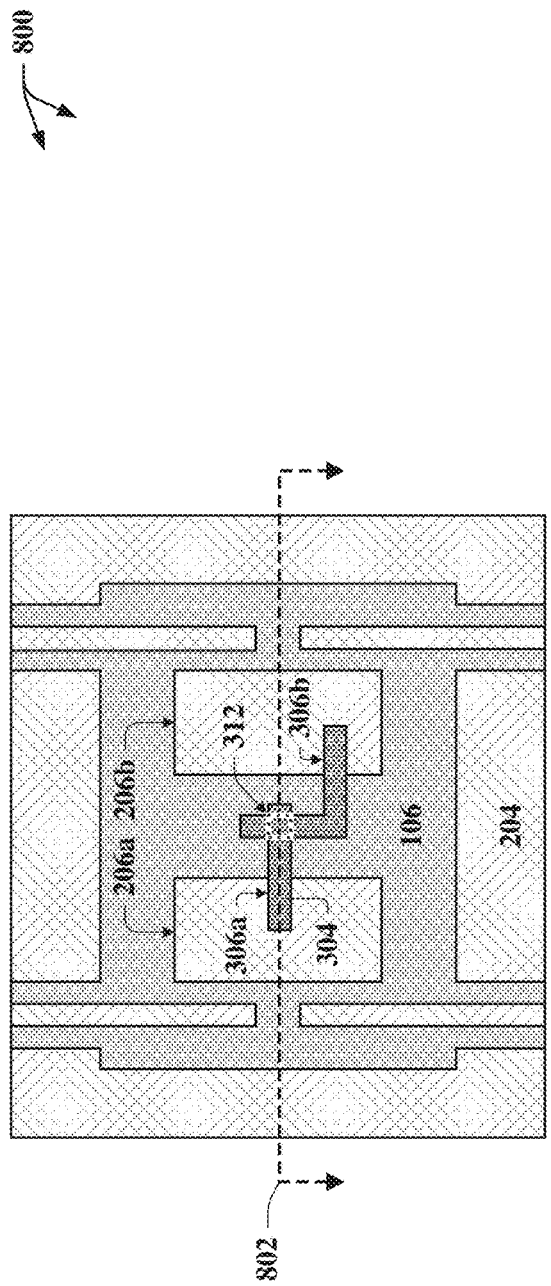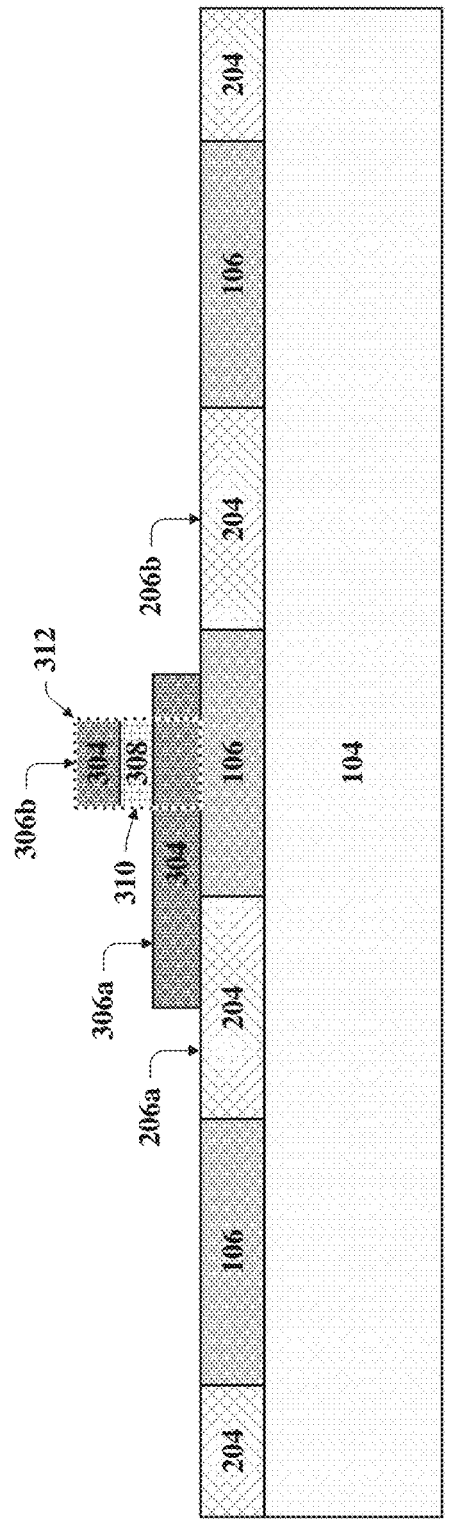
FIG. 8A
FIG. 8B

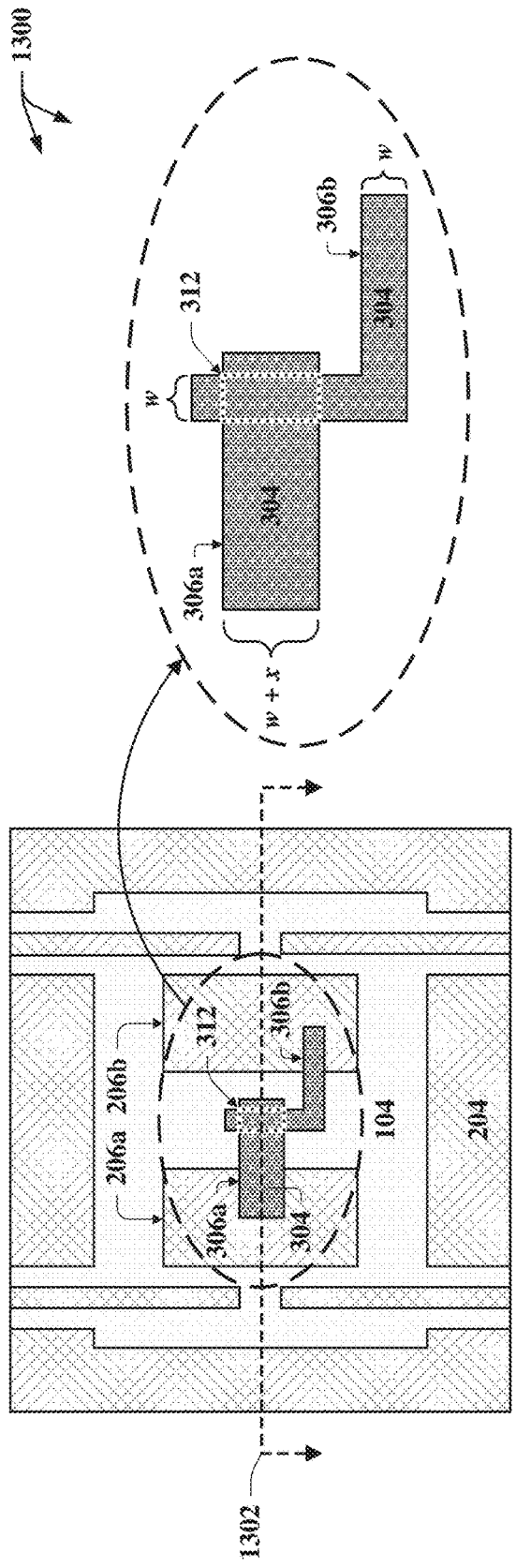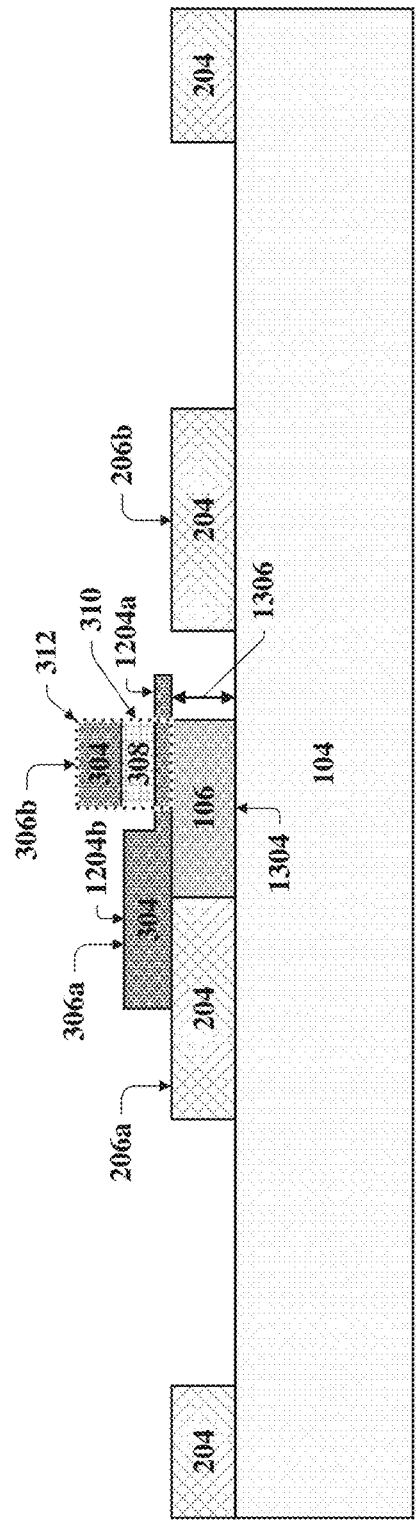
FIG. 13A
FIG. 13B

SACRIFICIAL MATERIAL FACILITATING PROTECTION OF A SUBSTRATE IN A QUBIT DEVICE

BACKGROUND

The subject disclosure relates to qubit devices and a method for forming the same. More specifically, the subject disclosure relates to sacrificial material facilitating protection of a substrate in a qubit device and a method for forming the same.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, methods, computer-implemented methods, and/or computer program products that facilitate protection of a substrate in a qubit device using sacrificial material are described.

According to an embodiment, a device can comprise a superconducting lead provided on a pillar of a sacrificial material provided on a substrate. The device can further comprise a collapsed superconducting junction provided on the substrate and coupled to the superconducting lead.

According to an embodiment, a method can comprise providing a sacrificial material on a substrate. The method can further comprise providing on the sacrificial material a superconducting junction coupled to a superconducting lead. The method can further comprise removing a portion of the sacrificial material to provide the superconducting lead on a pillar of the sacrificial material and to collapse the superconducting junction onto the substrate.

According to an embodiment, a device can comprise a first superconducting lead having a first thickness section and a second thickness section and provided on a sacrificial material provided on a substrate. The device can further comprise a second superconducting lead provided on an insulator provided on the first thickness section of the first superconducting lead.

DESCRIPTION OF THE DRAWINGS

FIGS. 2A and 2B illustrate top and cross-sectional side views, respectively, of the example, non-limiting device of FIGS. 1A and 1B after formation of capacitor pads on the layer of sacrificial material provided on the device of FIGS. 1A and 1B in accordance with one or more embodiments described herein.

FIGS. 3A and 3B illustrate top and cross-sectional side views, respectively, of the example, non-limiting device of FIGS. 2A and 2B after formation of superconducting leads and a superconducting junction on the device of FIGS. 2A and 2B in accordance with one or more embodiments described herein.

FIGS. 8A and 8B illustrate top and cross-sectional side views, respectively, of the example, non-limiting device of FIGS. 7A and 7B after formation of superconducting leads and a superconducting junction on the device of FIGS. 7A and 7B in accordance with one or more embodiments described herein.

FIGS. 13A and 13B illustrate top and cross-sectional side views, respectively, of the example, non-limiting device of FIGS. 12A and 12B after removing one or more portions of the sacrificial layer from the device of FIGS. 12A and 12B in accordance with one or more embodiments described herein.

DETAILED DESCRIPTION

Figure 1A:
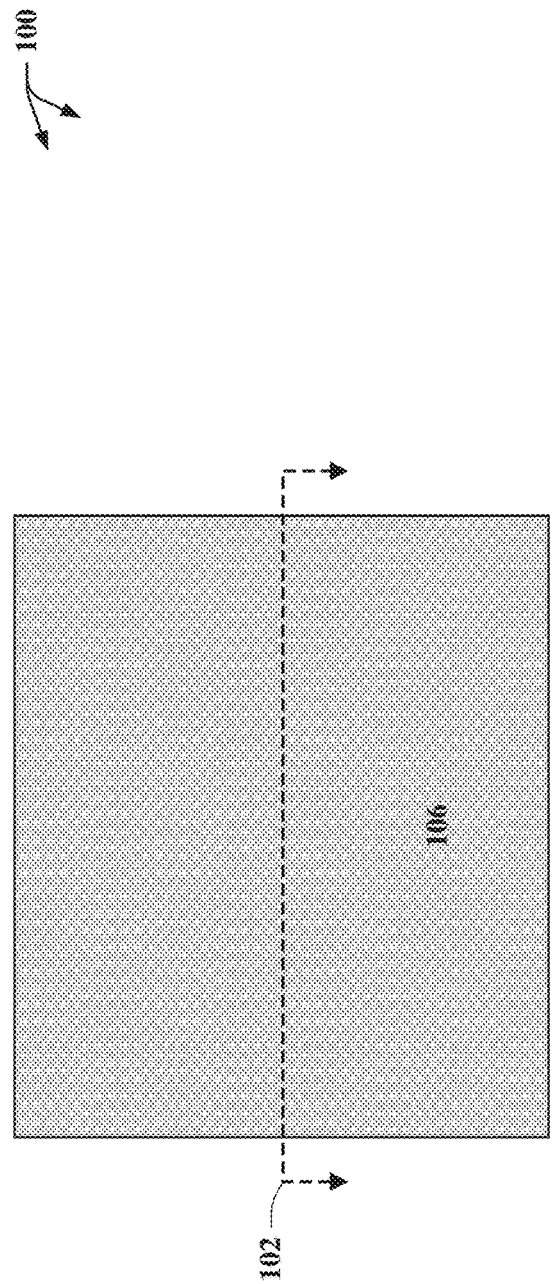
FIGS. 1A and 1B illustrate top and cross-sectional side views, respectively, of an example, non-limiting device that can comprise a substrate and a layer of sacrificial material provided on the substrate in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments of the subject disclosure are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It is noted that the drawings of the present application are provided for illustrative purposes only and, as such, the drawings are not drawn to scale.

It will be understood that when an element as a layer (also referred to as a film), region, and/or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. It will also be understood that when an element is referred to as being "coupled" to another element, it can describe one or more different types of coupling including, but not limited to, chemical coupling, communicative coupling, electrical coupling, electromagnetic coupling, operative coupling, optical coupling, physical coupling, thermal coupling, and/or another type of coupling.

Some existing techniques designed to prevent, limit, and/or remove damage to a substrate involve removing a portion of the substrate via selective etching and/or cleaning methods, where ever the substrate is exposed and/or damaged (e.g., removing a portion of a damaged surface on the substrate). Sapphire is a difficult material to selectively etch with respect to several superconducting materials. While the exposed regions of a substrate (e.g., a silicon (Si) substrate, a sapphire substrate, etc.) can be surface cleaned, buried interfaces such as, for example, an interface between the substrate and a superconducting junction lead (e.g., a lead coupled to a Josephson junction) or an interface between the substrate and a capacitor pad of the superconducting junction cannot be modified. Each of these regions could be a source of loss (e.g., energy loss), primarily due to process related surface damage (e.g., damage caused during a fabrication process or implementation process) and/or due to interfaces that are inherently lossy as a result of the material(s) present at such interfaces.

FIGS. 1A-4B illustrate an example, non-limiting multi-step fabrication sequence that can be implemented to fabricate one or more embodiments of the subject disclosure described herein and/or illustrated in the figures. For example, the non-limiting multi-step fabrication sequence described below and illustrated in FIGS. 1A-4B can be implemented to fabricate device 400 depicted in FIGS. 4A and 4B. Device 400 can comprise a semiconducting and superconducting device that can comprise and/or be implemented as a quantum device in a quantum computing device. For example, device 400 can comprise an integrated semiconducting and superconducting circuit (e.g., a quantum circuit) that can comprise and/or be implemented as a qubit device in a quantum computing device such as, for instance, quantum hardware, a quantum processor, a quantum computer, and/or another quantum computing device.

FIGS. 1A, 1B, and 5A-9B illustrate an example, non-limiting multi-step fabrication sequence that can be implemented to fabricate one or more embodiments of the subject disclosure described herein and/or illustrated in the figures. For example, the non-limiting multi-step fabrication sequence described below and illustrated in FIGS. 1A, 1B, and 5A-9B can be implemented to fabricate device 900 depicted in FIGS. 9A and 9B. Device 900 can comprise an example, non-limiting alternative embodiment of device 400 depicted in FIGS. 4A and 4B. Device 900 can comprise a semiconducting and superconducting device that can comprise and/or be implemented as a quantum device in a quantum computing device. For example, device 900 can comprise an integrated semiconducting and superconducting circuit (e.g., a quantum circuit) that can comprise and/or be implemented as a qubit device in a quantum computing device such as, for instance, quantum hardware, a quantum processor, a quantum computer, and/or another quantum computing device.

FIGS. 1A, 1B, 5A-8B, 10A, and 10B illustrate an example, non-limiting multi-step fabrication sequence that can be implemented to fabricate one or more embodiments of the subject disclosure described herein and/or illustrated in the figures. For example, the non-limiting multi-step fabrication sequence described below and illustrated in FIGS. 1A, 1B, 5A-8B, 10A, and 10B can be implemented to fabricate device 1000 depicted in FIGS. 10A and 10B. Device 1000 can comprise an example, non-limiting alternative embodiment of device 400 depicted in FIGS. 4A and 4B. Device 1000 can comprise a semiconducting and superconducting device that can comprise and/or be implemented as a quantum device in a quantum computing device. For example, device 1000 can comprise an integrated semiconducting and superconducting circuit (e.g., a quantum circuit) that can comprise and/or be implemented as a qubit device in a quantum computing device such as, for instance, quantum hardware, a quantum processor, a quantum computer, and/or another quantum computing device.

FIGS. 1A, 1B, 5A-8B, 11A, and 11B illustrate an example, non-limiting multi-step fabrication sequence that can be implemented to fabricate one or more embodiments of the subject disclosure described herein and/or illustrated in the figures. For example, the non-limiting multi-step fabrication sequence described below and illustrated in FIGS. 1A, 1B, 5A-8B, 10A, and 10B can be implemented to fabricate device 1100 depicted in FIGS. 11A and 11B. Device 1100 can comprise an example, non-limiting alternative embodiment of device 400 depicted in FIGS. 4A and 4B. Device 1100 can comprise a semiconducting and superconducting device that can comprise and/or be implemented as a quantum device in a quantum computing device. For example, device 1100 can comprise an integrated semiconducting and superconducting circuit (e.g., a quantum circuit) that can comprise and/or be implemented as a qubit device in a quantum computing device such as, for instance, quantum hardware, a quantum processor, a quantum computer, and/or another quantum computing device.

FIGS. 1A, 1B, 5A-7B, and 12A-13B illustrate an example, non-limiting multi-step fabrication sequence that can be implemented to fabricate one or more embodiments of the subject disclosure described herein and/or illustrated in the figures. For example, the non-limiting multi-step fabrication sequence described below and illustrated in FIGS. 1A, 1B, 5A-7B, and 12A-13B can be implemented to fabricate device 1300 depicted in FIGS. 13A and 13B.

Figure 4A:
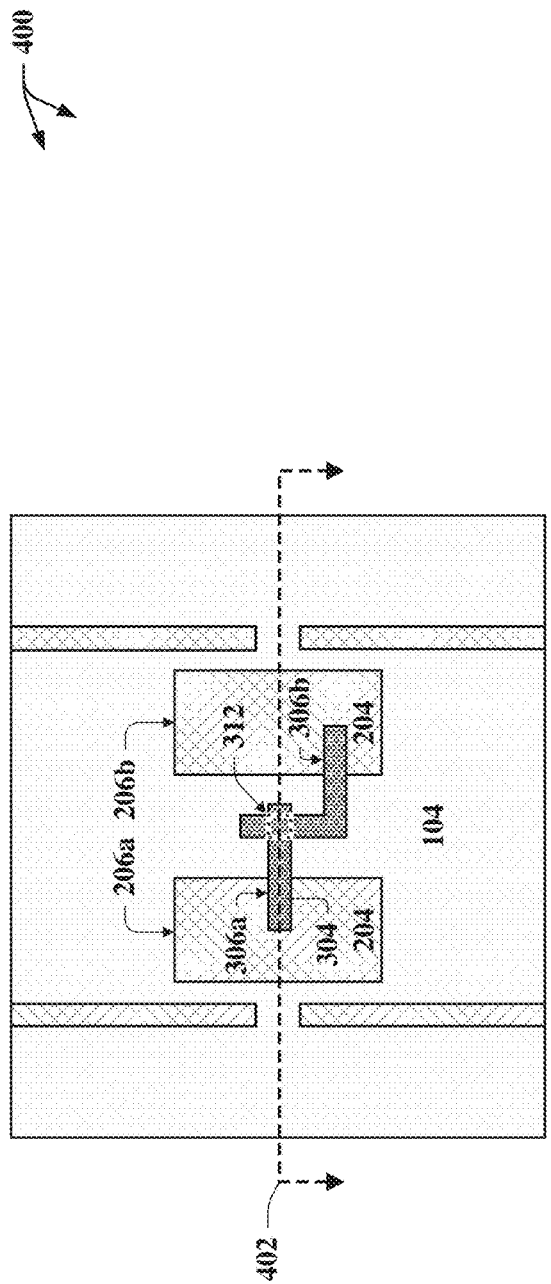
FIGS. 4A and 4B illustrate top and cross-sectional side views, respectively, of the example, non-limiting device of FIGS. 3A and 3B after removing one or more portions of the sacrificial layer from the device of FIGS. 3A and 3B in accordance with one or more embodiments described herein.
Figure 4B:
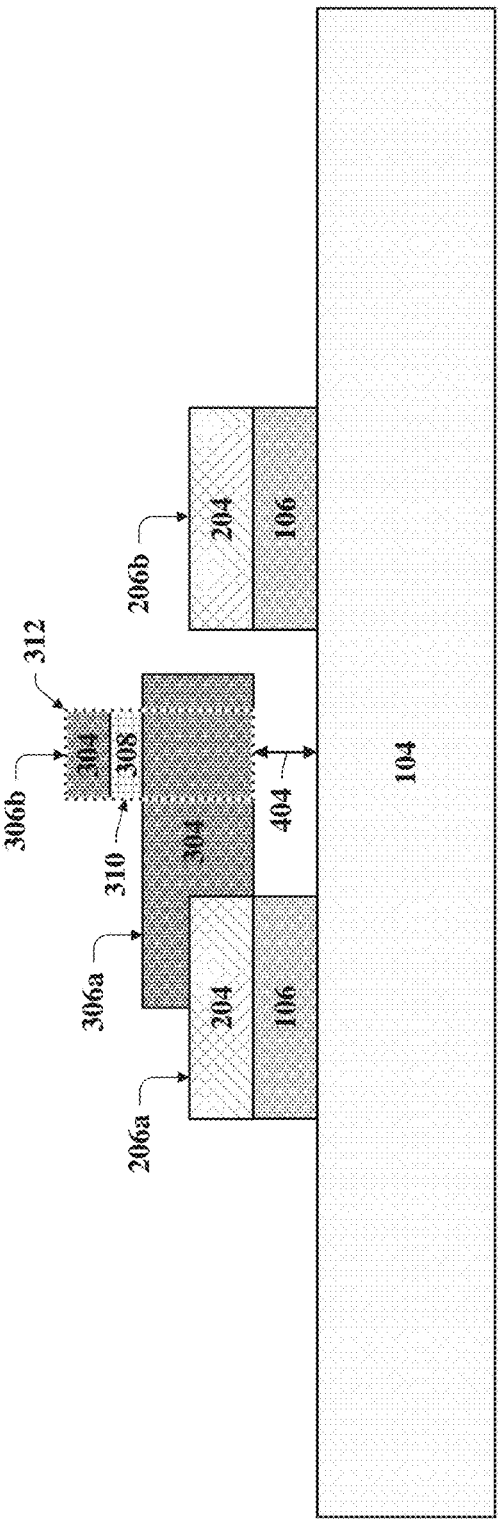

Device 1300 can comprise an example, non-limiting alternative embodiment of device 400 depicted in FIGS. 4A and 4B. Device 1300 can comprise a semiconducting and superconducting device that can comprise and/or be implemented as a quantum device in a quantum computing device. For example, device 1300 can comprise an integrated semiconducting and superconducting circuit (e.g., a quantum circuit) that can comprise and/or be implemented as a qubit device in a quantum computing device such as, for instance, quantum hardware, a quantum processor, a quantum computer, and/or another quantum computing device.

As described below with reference to FIGS. 1A-13B, fabrication of device 400, 900, 1000, 1100, and/or 1300 can comprise multi-step sequences of, for example, photolithographic and/or chemical processing steps that facilitate gradual creation of electronic-based systems, devices, components, and/or circuits in a semiconducting and superconducting device (e.g., an integrated circuit). For instance, device 400, 900, 1000, 1100, and/or 1300 can be fabricated by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, etc.), etching techniques (e.g., chemical vapor etch (CVE), reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), chemical vapor deposition (CVD), atomic layer deposition (ALD), physical vapor deposition (PVD), molecular beam epitaxy (MBE), electrochemical deposition (ECD), epitaxial deposition, chemical-mechanical planarization (CMP), backgrinding techniques, and/or another technique for fabricating an integrated circuit.

As referenced herein, "epitaxy" can describe a crystal growth process that can be employed to grow a new layer that is well oriented to a template (e.g., well oriented with respect to a substrate such as, for example, substrate 104 described below). Additionally, or alternatively, as referenced herein, "epitaxy" can describe a gas-phase epitaxy performed in a vacuum chamber at elevated temperature such as, for instance, low pressure chemical vapor deposition (LPCVD) or rapid thermal chemical vapor deposition (RTCVD), with precursor gases such as, for example, silane ($SiH_4$), dichlorosilane ($H_2SiCl_2$), germane ($GeH_4$), and/or another gas. As referenced herein, "chemical vapor etch (CVE)" can describe a gas phase removal of a material performed in a vacuum chamber at elevated temperature in a reactive ambient. Additionally, or alternatively, as referenced herein, "chemical vapor etch (CVE)" can describe a gas phase removal of a material performed using hydrogen chloride (HCl) as the etch gas, which removes some materials such as, for instance, silicon-germanium (SiGe) at a much higher rate than silicon (Si).

As described below with reference to FIGS. 1A-13B, device 400, 900, 1000, 1100, and/or 1300 can be fabricated using various materials. For example, device 400, 900, 1000, 1100, and/or 1300 can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

Figure 1B:
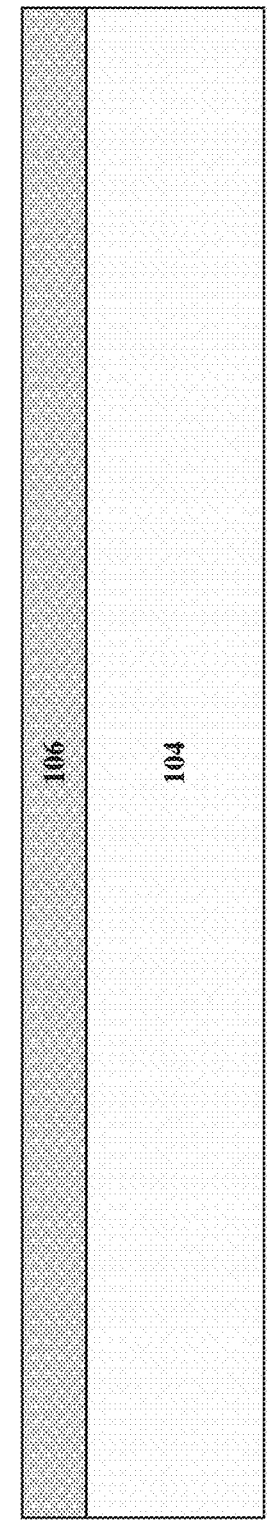

FIG. 1A illustrates a top view of an example, non-limiting device 100 that can comprise a substrate and a layer of sacrificial material provided on the substrate in accordance with one or more embodiments described herein. FIG. 1B illustrates a cross-sectional side view of device 100 as viewed along a plane defined by line 102. As described in detail below, device 100 can be developed into device 400, 900, 1000, 1100, and/or 1300 depicted in FIGS. 4A and 4B, 9A and 9B, 10A and 10B, 11A and 11B, and 13A and 13B, respectively, where each of such devices can comprise a qubit device that can facilitate protection of a substrate in the device using sacrificial material in accordance with one or more embodiments described herein.

Device 100 can comprise a substrate 104. Substrate 104 can comprise any material having semiconductor properties including, but not limited to, silicon (Si), sapphire (e.g., aluminum oxide ($Al_2O_3$)), silicon-germanium (SiGe), silicon-germanium-carbon (SiGeC), silicon carbide (SiC), germanium (Ge) alloys, III/V compound semiconductors, II/VI compound semiconductors, and/or another material. In some embodiments, substrate 104 can comprise a layered semiconductor including, but not limited to, silicon/silicon-germanium (Si/SiGe), silicon/silicon carbide (Si/SiC), silicon-on-insulators (SOIs), silicon germanium-on-insulators (SGOIs), and/or another layered semiconductor. In some embodiments, substrate 104 can comprise a single element semiconductor substrate or a compound semiconductor substrate. In the various example embodiments described herein and/or illustrated in the figures, substrate 104 can comprise a silicon (Si) substrate. Substrate 104 can comprise a thickness (e.g., height) ranging from approximately 50 micrometers ($\mu m$) to approximately 1 millimeter (mm).

Device 100 can further comprise a layer of sacrificial material 106 that can be deposited or grown (e.g., via epitaxial deposition) on substrate 104 as illustrated in FIGS. 1A and 1B. In some embodiments, sacrificial material 106 can comprise a superconducting material (e.g., a low interface loss superconducting material). For example, in these embodiments, sacrificial material can comprise a superconducting material including, but not limited to, niobium (Nb), titanium (Ti), molybdenum (Mo), niobium nitride (NbN), titanium nitride (TiN), molybdenum nitride (MoN), niobium titanium nitride (NbTiN), and/or another superconducting material. In some embodiments, sacrificial material 106 can comprise a dielectric material (e.g., a low loss dielectric material). For example, in these embodiments, sacrificial material 106 can comprise a dielectric material including, but not limited to, germanium (Ge), silicon-germanium (SiGe), and/or another dielectric material. In some embodiments, sacrificial material 106 can comprise a material that is not a source of quasiparticles at an interface of a component that can be formed using sacrificial material 106. In some embodiments, sacrificial material 106 can comprise a material that can serve as a quasiparticle trap. These examples of materials are not intended to be limiting. From this disclosure, those of ordinary skill in the art will be able to conceive of many other materials suitable for forming sacrificial material 106 and the same are contemplated within the scope of the illustrative embodiments.

Sacrificial material 106 can be deposited or grown on substrate 104 using one or more material deposition techniques, polishing techniques, and/or cleaning techniques defined above (e.g., epitaxial deposition, LPCVD, RTCVD, CVD, ALD, PVD, MBE, ECD, CMP, backgrinding, etc.). Sacrificial material 106 can be deposited on substrate 104 such that it can comprise a thickness (e.g., height) ranging from approximately 10 nanometers (nm) to approximately 500 nm. It should be appreciated that sacrificial material 106 can protect substrate 104 from damage that can result during the example, non-limiting multi-step fabrication sequences described herein with reference to FIGS. 1A-13B that can be implemented to fabricate device 400, 900, 1000, 1100, and/or 1300.

FIG. 2A illustrates a top view of the example, non-limiting device 100 of FIGS. 1A and 1B after formation of capacitor pads on the layer of sacrificial material provided on device 100 in accordance with one or more embodiments described herein. FIG. 2B illustrates a cross-sectional side view of device 200 as viewed along a plane defined by line 202. Repetitive description of like elements and/or processes employed in other embodiments described herein is omitted for sake of brevity.

Device 200 can comprise an example, non-limiting alternative embodiment of device 100 after depositing or growing material 204 on sacrificial material 106 and forming capacitor pads 206a, 206b as illustrated in FIGS. 2A and 2B. In some embodiments, material 204 can comprise a superconducting material. For example, in these embodiments, sacrificial material can comprise a superconducting material including, but not limited to, aluminum (Al) and/or another superconducting material. In some embodiments, material 204 can comprise a dielectric material (e.g., a low loss dielectric material). For example, in these embodiments, material 204 can comprise a dielectric material including, but not limited to, germanium (Ge), silicon-germanium (SiGe), and/or another dielectric material. These examples of materials are not intended to be limiting. From this disclosure, those of ordinary skill in the art will be able to conceive of many other materials suitable for forming material 204 and the same are contemplated within the scope of the illustrative embodiments.

Capacitor pads 206a, 206b can be formed on sacrificial material 106 using one or more material deposition techniques, photolithography techniques, etching techniques, polishing techniques, and/or cleaning techniques defined above (e.g., a lithographic patterning process, epitaxial deposition, LPCVD, RTCVD, CVD, ALD, PVD, MBE, ECD, CVE, RIE, dry etching, wet etching, ion beam etching, plasma etching, laser ablation, material lift off (e.g., washing with a solvent, stripping, etc.), CMP, backgrinding, etc.). For example, material 204 can be deposited or grown on sacrificial material 106 using one or more material deposition techniques, polishing techniques, and/or cleaning techniques defined above (e.g., epitaxial deposition, LPCVD, RTCVD, CVD, ALD, PVD, MBE, ECD, CMP, backgrinding, etc.). For instance, material 204 can be deposited or grown on sacrificial material 106 such that it can comprise a thickness (e.g., height) ranging from approximately 20 nm to approximately 500 nm.

In the above example, based on depositing or growing material 204 on sacrificial material 106 as described above, a photoresist material (e.g., a positive-tone photoresist, a negative-tone photoresist, a hybrid-tone photoresist, etc.) can be formed and/or patterned on material 204 to define the shape and/or dimensions of capacitor pads 206a, 206b on sacrificial material 106. For instance, such a photoresist material can be formed and/or patterned on material 204 to define the shape and/or dimensions of capacitor pads 206a, 206b such that they each can have a substantially rectangular shape as illustrated in FIG. 2A. Although capacitor pads 206a, 206b are illustrated in the example embodiment depicted in FIGS. 2A and 2B as having a substantially rectangular shape, it should be appreciated that the subject disclosure is not so limiting. For example, the photoresist material described above can be formed and/or patterned on material 204 such that capacitor pads 206a, 206b can have any desired shape and/or any desired dimensions. From this disclosure, those of ordinary skill in the art will be able to conceive of many other shapes and/or dimensions suitable for forming capacitor pads 206a, 206b and the same are contemplated within the scope of the illustrative embodiments.

In the above example, based on forming and/or patterning the photoresist material on material 204 to define the shape and/or dimensions of capacitor pads 206a, 206b as described above, an etching process (e.g., CVP, RIE, dry etching, wet etching, ion beam etching, plasma etching, laser ablation, etc.) can be performed to remove portions of material 204, thereby yielding capacitor pads 206a, 206b illustrated in FIGS. 2A and 2B. In this example, based on removing portions of material 204 to form capacitor pads 206a, 206b, the photoresist material can be stripped using, for instance, a solvent.

It should be appreciated that performing such an etching process described above to remove portions of material 204 can also remove a relatively small amount of sacrificial material 106. However, a substantial amount (e.g., substantially most) of sacrificial material 106 will remain on device 200 as illustrated in the example embodiment depicted in FIGS. 2A and 2B to protect substrate 104 from damage during the above described etching process and/or during subsequent fabrication processing. It should also be appreciated that material 204 and/or capacitor pads 206a, 206b can be indicative of hardmask component(s) that can protect and/or, in some embodiments, prevent removal of one or more portions of sacrificial material 106 and/or substrate 104 positioned under material 204 and/or capacitor pads 206a, 206b during one or more subsequent material removal processes (e.g., etching processes) that can be performed (e.g., as described below with reference to FIGS. 4A and 4B).

In some embodiments, capacitor pads 206a, 206b illustrated in FIGS. 2A and 2B can also be formed using a lift off structure and/or a lift off technique. For example, although not illustrated in FIG. 2A or 2B, a photoresist material (e.g., a positive-tone photoresist, a negative-tone photoresist, a hybrid-tone photoresist, etc.) can be formed and/or patterned on sacrificial material 106 of device 100 to define the shape and/or dimensions of capacitor pads 206a, 206b on sacrificial material 106. For instance, such a photoresist material can be formed and/or patterned on sacrificial material 106 such that pockets (e.g., voids, holes, ports, etc.) having a substantially rectangular shape, or another shape, are formed in the photoresist material to define the shape and/or dimensions of capacitor pads 206a, 206b.

In the above example, based on forming and/or patterning the photoresist material on sacrificial material 106 to form such pockets that define the shape and/or dimensions of capacitor pads 206a, 206b as described above, material 204 can be deposited or grown on the photoresist material and on exposed surfaces (e.g., top surfaces) of sacrificial material 106 located inside the pockets formed in the photoresist material. For example, material 204 can be deposited or grown on the photoresist material and on such exposed surfaces (e.g., top surfaces) of sacrificial material 106 located inside the pockets formed in the photoresist material using one or more material deposition techniques, polishing techniques, and/or cleaning techniques defined above (e.g., epitaxial deposition, LPCVD, RTCVD, CVD, ALD, PVD, MBE, ECD, CMP, backgrinding, etc.). For instance, material 204 can be deposited or grown on the photoresist material and on such exposed surfaces (e.g., top surfaces) of sacrificial material 106 located inside the pockets formed in the photoresist material such that material 204 can comprise a thickness (e.g., height) ranging from approximately 20 nm to approximately 500 nm.

In the above example, based on depositing or growing material 204 on the photoresist material and on such exposed surfaces (e.g., top surfaces) of sacrificial material 106 located inside the pockets formed in the photoresist material, the photoresist material and the portions of material 204 deposited or grown on the photoresist material can be removed using a lift off technique. For instance, the photoresist material and the portions of material 204 deposited or grown on the photoresist material can be removed using, for example, a solvent to lift off the photoresist material and the portions of material 204 deposited or grown thereon, thereby yielding capacitor pads 206a, 206b illustrated in the example embodiments depicted in FIGS. 2A and 2B.

FIG. 3A illustrates a top view of the example, non-limiting device 200 of FIGS. 2A and 2B after formation of superconducting leads and a superconducting junction on device 200 in accordance with one or more embodiments described herein. FIG. 3B illustrates a cross-sectional side view of device 300 as viewed along a plane defined by line 302. Repetitive description of like elements and/or processes employed in other embodiments described herein is omitted for sake of brevity.

Device 300 can comprise an example, non-limiting alternative embodiment of device 200 after depositing or growing superconducting material 304 on capacitor pads 206a, 206b and sacrificial material 106 to form superconducting leads 306a, 306b and a layer of insulating material 308 between superconducting leads 306a, 306b as illustrated in FIGS. 3A and 3B. In the example embodiment illustrated in FIGS. 3A and 3B, such a layer of insulating material 308 can comprise, for instance, aluminum oxide ($Al_2O_3$) and/or another insulating material that can form an insulator 310 positioned between superconducting leads 306a, 306b. In this example embodiment, insulator 310 can serve as a tunnel junction in a superconducting junction 312 that can comprise insulator 310 and portions of superconducting leads 306a, 306b as illustrated in the example embodiment depicted in FIGS. 3A and 3B, where superconducting junction 312 is represented as a substantially square shaped dashed line in FIG. 3A and as a substantially rectangular shaped dashed line in FIG. 3B. In some embodiments, superconducting junction 312 can comprise a Josephson junction and/or a superconducting Josephson junction.

In the example embodiment illustrated in FIGS. 3A and 3B, superconducting material 304 can comprise a superconducting material including, but not limited to, aluminum (Al) and/or another superconducting material. This example of materials is not intended to be limiting. From this disclosure, those of ordinary skill in the art will be able to conceive of many other materials suitable for forming superconducting material 304 and the same are contemplated within the scope of the illustrative embodiments.

Superconducting leads 306a, 306b, insulator 310, and/or superconducting junction 312 can be formed on device 200 as illustrated in FIGS. 3A and 3B using one or more material deposition techniques, photolithography techniques, etching techniques, polishing techniques, and/or cleaning techniques defined above (e.g., a lithographic patterning process, epitaxial deposition, LPCVD, RTCVD, CVD, ALD, PVD, MBE, ECD, CVE, RIE, dry etching, wet etching, ion beam etching, plasma etching, laser ablation, material lift off (e.g., washing with a solvent, stripping, etc.), CMP, backgrinding, etc.). For example, superconducting leads 306a, 306b, insulator 310, and/or superconducting junction 312 can be formed on device 200 as illustrated in FIGS. 3A and 3B using the Niemeyer-Dolan technique (also referred to as the Dolan technique, the Dolan bridge technique, the shadow evaporation technique, the shadow angle evaporation technique, etc.). For instance, superconducting leads 306a, 306b, insulator 310, and/or superconducting junction 312 can be formed on device 200 using the Niemeyer-Dolan technique, where:

a) an evaporation mask (not shown in the figures) can be formed using, for instance, two layers of photoresist such that the mask is suspended above device 200 and comprises one or more openings that enable deposition of superconducting material 304 onto device 200 at various angles with respect to the top surfaces of device 200 depicted in FIG. 2A (e.g., various evaporation angles with respect to top surfaces of sacrificial material 106 and capacitor pads 206a, 206b);

b) superconducting lead 306a can be formed on device 200 as illustrated in FIGS. 3A and 3B by depositing superconducting material 304 through such one or more openings on the mask and onto sacrificial material 106 and capacitor pad 206a at a first evaporation angle and a first evaporation direction that can each be defined with respect to the top surfaces of device 200 depicted in FIG. 2A (e.g., top surfaces of sacrificial material 106 and capacitor pads 206a, 206b);

c) insulator 310 can be formed on superconducting lead 306a by exposing a relatively small amount of ambient (e.g., atmosphere, air, etc.) to superconducting material 304 and/or superconducting lead 306a prior to forming superconducting lead 306b on device 200; and/or d) superconducting lead 306b can be formed on device 200 as illustrated in FIGS. 3A and 3B (e.g., where a portion of superconducting lead 306b is formed on and overlaps a portion of superconducting lead 306a and insulator 310) by depositing superconducting material 304 through the one or more openings on the mask and onto sacrificial material 106, capacitor pad 206b, superconducting lead 306a, and/or insulator 310 at a second evaporation angle and a second evaporation direction that can each be defined with respect to top surfaces of device 200 depicted in FIG. 2A (e.g., top surfaces of sacrificial material 106 and capacitor pads 206a, 206b).

Superconducting leads 306a, 306b can be formed on device 200 as illustrated in FIGS. 3A and 3B, where each superconducting lead 306a, 306b can comprise various shapes and/or dimensions (e.g., width, length, thickness, etc.) that can depend on how superconducting material 304 is deposited on device 200 using the Niemeyer-Dolan technique described above (e.g., depending on the shape and/or dimensions of the mask and/or the one or more openings on the mask, depending on the first and second evaporation angles, depending on the first and second evaporation directions, etc.). All such various shapes and/or dimensions are contemplated within the scope of the illustrative embodiments of the subject disclosure. In some embodiments, superconducting leads 306a, 306b can comprise the same uniform width or different uniform widths (e.g., the same contiguous width or different contiguous widths with respect to each of superconducting leads 306a, 306b). For example, in one or more embodiments of the subject disclosure, superconducting lead 306a can comprise a uniform width that is greater than that of superconducting lead 306b, or vice versa. For instance, as described below and illustrated in the inset views depicted in FIGS. 12A and 13A, superconducting lead 306b can comprise a uniform width w and superconducting lead 306a can comprise a uniform width w+x, where x denotes a defined unit of distance (e.g., x nanometers (nm)).

It should be appreciated that superconducting material 304, superconducting leads 306a, 306b, and/or superconducting junction 312 can be indicative of hardmask component(s) that can protect and/or, in some embodiments, prevent removal of one or more portions of sacrificial material 106 and/or substrate 104 positioned under superconducting material 304, superconducting leads 306a, 306b, and/or superconducting junction 312 during one or more subsequent material removal processes (e.g., etching processes) that can be performed.

FIG. 4A illustrates a top view of the example, non-limiting device 300 of FIGS. 3A and 3B after removing one or more portions of the sacrificial layer from device 300 in accordance with one or more embodiments described herein. FIG. 4B illustrates a cross-sectional side view of device 400 as viewed along a plane defined by line 402. Repetitive description of like elements and/or processes employed in other embodiments described herein is omitted for sake of brevity.

Device 400 can comprise an example, non-limiting alternative embodiment of device 300 after removing one or more portions of sacrificial material 106 from device 300 as illustrated in the example embodiment depicted in FIGS. 4A and 4B. In this example embodiment, such one or more portions of sacrificial material 106 can be removed from device 300 using one or more etching techniques defined herein (e.g., CVP, RIE, dry etching, wet etching, ion beam etching, plasma etching, laser ablation, etc.) to yield device 400 depicted in FIGS. 4A and 4B. In some embodiments, such one or more portions of sacrificial material 106 can be removed from device 300 using a blanket etch technique, for example, with a differential etch chemistry.

In some embodiments, some portions of sacrificial material 106 can be removed from device 300, while other portions of sacrificial material 106 can remain under capacitor pads 206a, 206b, for example, as illustrated in FIGS. 4A and 4B. In some embodiments, such portions of sacrificial material 106 can be removed from device 300 to suspend portions of superconducting leads 306a, 306b, as well as insulator 310 and superconducting junction 312 over substrate 104, thereby providing a gap 404 between the bottom surfaces of the suspended sections of superconducting leads 306a, 306b and the top surface of substrate 104. Although not illustrated in FIG. 4A or 4B, in some embodiments, superconducting leads 306a, 306b can be formed with a defined thickness that enables one or both of superconducting leads 306a, 306b, as well as insulator 310 and superconducting junction 312 to collapse onto substrate 104 upon removal of such portions of sacrificial material 106 from device 300 as described above.

Although not illustrated in FIG. 4A or 4B, in some embodiments, some portions of sacrificial material 106 can be removed from device 300, while other portions of sacrificial material 106 can remain under capacitor pads 206a, 206b and one or more portions of superconducting leads 306a, 306b. For example, in some embodiments, some portions of sacrificial material 106 can be removed from device 300, while other portions of sacrificial material 106 can remain under capacitor pads 206a, 206b and one or more portions of superconducting leads 306a, 306b to provide at least one pillar of sacrificial material 106 that can support such portion(s) of superconducting leads 306a, 306b (e.g., to provide at least one pillar of sacrificial material 106 similar to pillars 1004 described below and illustrated in FIGS. 10B and 11B). In these embodiments, the portions of superconducting leads 306a, 306b that are not supported by such at least one pillar of sacrificial material 106 can either be suspended over substrate 104 upon removal of all other portions of sacrificial material 106 from device 300 (e.g., to provide gap 404) or they can collapse onto substrate 104, depending on the thickness of superconducting leads 306a, 306b.

As described above, sacrificial material 106 can protect substrate 104 from damage that can result during the example, non-limiting multi-step fabrication sequence described herein with reference to FIGS. 1A-4B that can be implemented to fabricate device 400. In some embodiments, removal of such portions of sacrificial material 106 from device 300 as described above and depicted in FIGS. 4A and 4B can comprise a final step in such a fabrication sequence. In these embodiments, removing such portions of sacrificial material 106 as a final step in the fabrication of device 400 can thereby enable device 400 to facilitate reduced energy loss and/or reduced two level system density at the interfaces between substrate 104 and the portions of sacrificial material 106 remaining under capacitor pads 206a, 206b or at an interface between substrate 104 and air exposed to substrate 104.

Figure 5A:
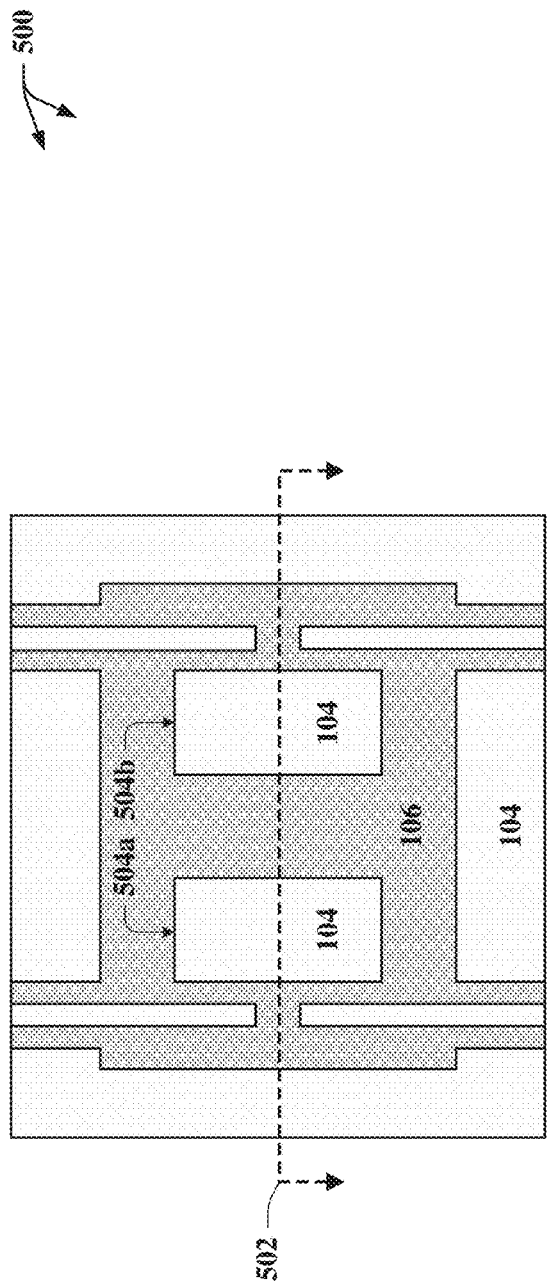
FIGS. 5A and 5B illustrate top and cross-sectional side views, respectively, of the example, non-limiting device of FIGS. 1A and 1B after removing portions of the sacrificial layer from the device of FIGS. 1A and 1B to form pockets in the sacrificial layer in accordance with one or more embodiments described herein.
Figure 5B:
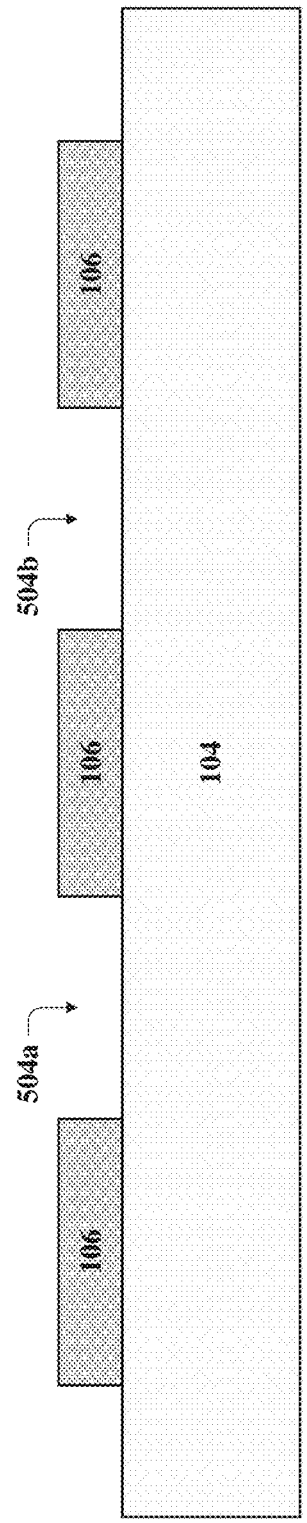

FIG. 5A illustrates a top view of the example, non-limiting device 100 of FIGS. 1A and 1B after removing portions of the sacrificial layer from device 100 to form pockets in the sacrificial layer in accordance with one or more embodiments described herein. FIG. 5B illustrates a cross-sectional side view of device 500 as viewed along a plane defined by line 502. Repetitive description of like elements and/or processes employed in other embodiments described herein is omitted for sake of brevity.

Device 500 can comprise an example, non-limiting alternative embodiment of device 100 after removing portions of sacrificial material 106 from device 100 as illustrated in the example embodiment depicted in FIGS. 5A and 5B to form pockets 504a, 504b in sacrificial material 106. In this example embodiment, such portions of sacrificial material 106 can be removed from device 100 to form pockets 504a, 504b using one or more photolithography techniques, etching techniques, polishing techniques, and/or cleaning techniques defined above (e.g., a lithographic patterning process, CVE, RIE, dry etching, wet etching, ion beam etching, plasma etching, laser ablation, material lift off (e.g., washing with a solvent, stripping, etc.), CMP, backgrinding, etc.). For example, although not illustrated in FIG. 5A or 5B, a photoresist material (e.g., a positive-tone photoresist, a negative-tone photoresist, a hybrid-tone photoresist, etc.) can be formed and/or patterned on sacrificial material 106 of device 100 to define the shape and/or dimensions of pockets 504a, 504b on sacrificial material 106. In this example, the photoresist material can be formed and/or patterned on sacrificial material 106 of device 100 such that the shape and/or dimensions of pockets 504a, 504b can be the same as the shape and/or dimensions of capacitor pads 206a, 206b of device 200 described above with reference to FIGS. 2A and 2B. In this example, based on forming and/or patterning the photoresist material on sacrificial material 106 to define the shape and/or dimensions of pockets 504a, 504b, an etching process (e.g., CVP, RIE, dry etching, wet etching, ion beam etching, plasma etching, laser ablation, etc.) can be performed to remove portions of sacrificial material 106, thereby yielding pockets 504a, 504b illustrated in FIGS. 5A and 5B. In this example, based on removing portions of sacrificial material 106 to form pockets 504a, 504b, the photoresist material can be removed using a lift off technique (e.g., washing with a solvent, stripping, etc.).

Figure 6A:
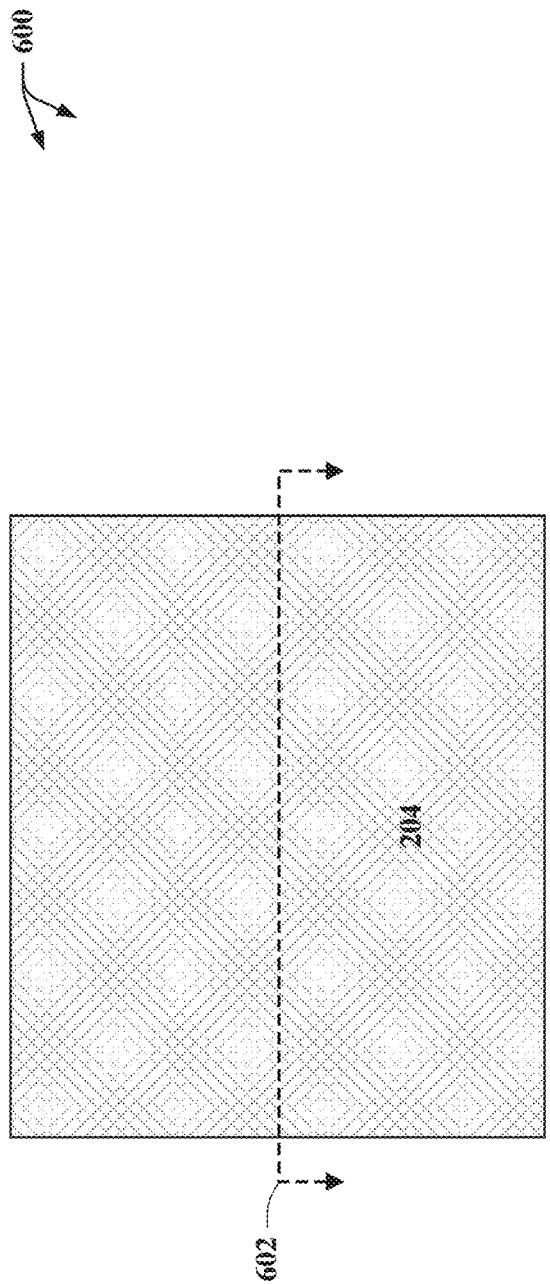
FIGS. 6A and 6B illustrate top and cross-sectional side views, respectively, of the example, non-limiting device of FIGS. 5A and 5B after depositing a layer of material in the pockets formed in the sacrificial material on the device of FIGS. 5A and 5B in accordance with one or more embodiments described herein.
Figure 6B:
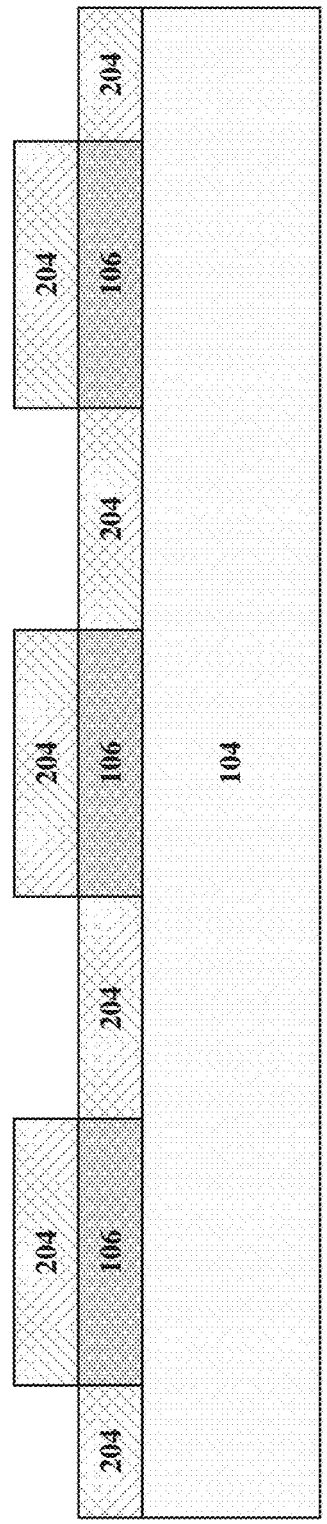

FIG. 6A illustrates a top view of the example, non-limiting device 500 of FIGS. 5A and 5B after depositing a layer of material in the pockets formed in the sacrificial material on device 500 in accordance with one or more embodiments described herein. FIG. 6B illustrates a cross-sectional side view of device 600 as viewed along a plane defined by line 602. Repetitive description of like elements and/or processes employed in other embodiments described herein is omitted for sake of brevity.

Device 600 can comprise an example, non-limiting alternative embodiment of device 500 after depositing or growing material 204 described above with reference to FIGS. 2A and 2B on device 500 as illustrated in FIGS. 6A and 6B. For example, device 600 can comprise an example, non-limiting alternative embodiment of device 500 after depositing or growing material 204 in pockets 504a, 504b of device 500, as well as on exposed surfaces of substrate 104 and sacrificial material 106 as illustrated in FIGS. 6A and 6B. Material 204 can be deposited or grown on device 500 as described above using one or more material deposition techniques, polishing techniques, and/or cleaning techniques defined above (e.g., epitaxial deposition, LPCVD, RTCVD, CVD, ALD, PVD, MBE, ECD, CMP, backgrinding, etc.).

Figure 7A:
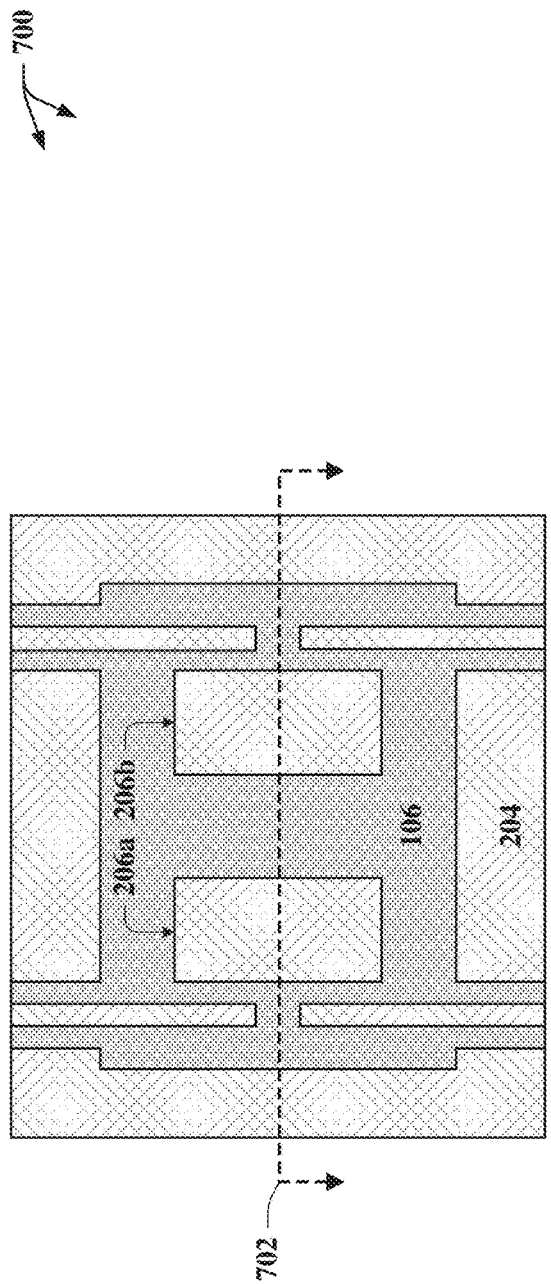
FIGS. 7A and 7B illustrate top and cross-sectional side views, respectively, of the example, non-limiting device of FIGS. 6A and 6B after formation of capacitor pads on the device of FIGS. 6A and 6B in accordance with one or more embodiments described herein.
Figure 7B:
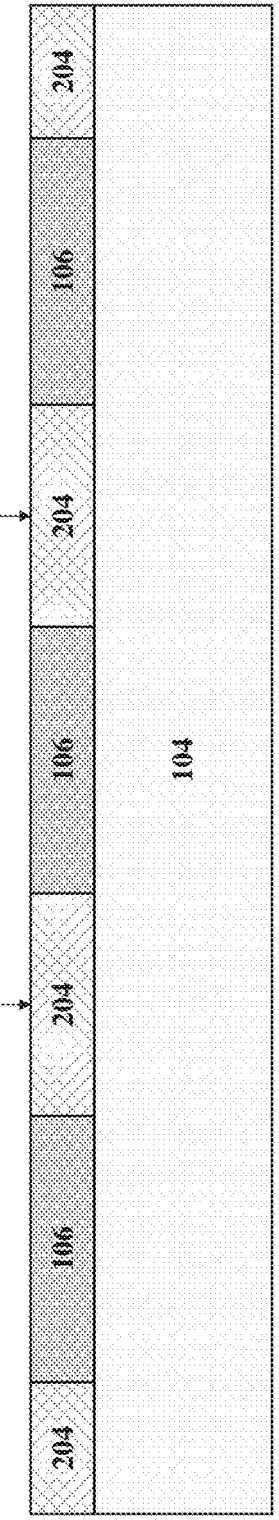

FIG. 7A illustrates a top view of the example, non-limiting device 600 of FIGS. 6A and 6B after formation of capacitor pads on device 500 in accordance with one or more embodiments described herein. FIG. 7B illustrates a cross-sectional side view of device 700 as viewed along a plane defined by line 702. Repetitive description of like elements and/or processes employed in other embodiments described herein is omitted for sake of brevity.

Device 700 can comprise an example, non-limiting alternative embodiment of device 600 after removing portions of material 204 from device 600 to form capacitor pads 206a, 206b on device 600 as illustrated in FIGS. 7A and 7B. In the example embodiment illustrated in FIGS. 7A and 7B, capacitor pads 206a, 206b can be formed on device 600 by removing portions of material 204 from sacrificial material 106 using one or more etching techniques, polishing techniques, and/or cleaning techniques defined above (e.g., CVE, RIE, dry etching, wet etching, ion beam etching, plasma etching, laser ablation, material lift off (e.g., washing with a solvent, stripping, etc.), CMP, backgrinding, etc.).

FIG. 8A illustrates a top view of the example, non-limiting device 700 of FIGS. 7A and 7B after formation of superconducting leads and a superconducting junction on device 700 in accordance with one or more embodiments described herein. FIG. 8B illustrates a cross-sectional side view of device 800 as viewed along a plane defined by line 802. Repetitive description of like elements and/or processes employed in other embodiments described herein is omitted for sake of brevity.

Device 800 can comprise an example, non-limiting alternative embodiment of device 700 after depositing or growing superconducting material 304 described above with reference to FIGS. 3A and 3B on device 700 as illustrated in FIGS. 8A and 8B. For example, device 800 can comprise an example, non-limiting alternative embodiment of device 700 after depositing or growing superconducting material 304 on capacitor pads 206a, 206b and sacrificial material 106 of device 700 to form superconducting leads 306a, 306b, insulating material 308, insulator 310, and superconducting junction 312 described above with reference to FIGS. 3A and 3B.

Superconducting leads 306a, 306b, insulator 310, and/or superconducting junction 312 can be formed on device 700 as illustrated in FIGS. 8A and 8B using one or more material deposition techniques, photolithography techniques, etching techniques, polishing techniques, and/or cleaning techniques defined above (e.g., a lithographic patterning process, epitaxial deposition, LPCVD, RTCVD, CVD, ALD, PVD, MBE, ECD, CVE, RIE, dry etching, wet etching, ion beam etching, plasma etching, laser ablation, material lift off (e.g., washing with a solvent, stripping, etc.), CMP, backgrinding, etc.). For example, superconducting leads 306a, 306b, insulator 310, and/or superconducting junction 312 can be formed on device 700 as illustrated in FIGS. 8A and 8B using the Niemeyer-Dolan technique described above with reference to FIGS. 3A and 3B. For instance, superconducting leads 306a, 306b, insulator 310, and/or superconducting junction 312 can be formed on device 700 using the Niemeyer-Dolan technique, where:

a) an evaporation mask (not shown in the figures) can be formed using, for instance, two layers of photoresist such that the mask is suspended above device 700 and comprises one or more openings that enable deposition of superconducting material 304 onto device 700 at various angles with respect to the top surfaces of device 700 depicted in FIG. 7A (e.g., various evaporation angles with respect to top surfaces of sacrificial material 106 and capacitor pads 206a, 206b);

b) superconducting lead 306a can be formed on device 700 as illustrated in FIGS. 8A and 8B by depositing superconducting material 304 through such one or more openings on the mask and onto sacrificial material 106 and capacitor pad 206a at a first evaporation angle and a first evaporation direction that can each be defined with respect to the top surfaces of device 700 depicted in FIG. 7A (e.g., top surfaces of sacrificial material 106 and capacitor pads 206a, 206b);

c) insulator 310 can be formed on superconducting lead 306a by exposing a relatively small amount of ambient (e.g., atmosphere, air, etc.) to superconducting material 304 and/or superconducting lead 306a prior to forming superconducting lead 306b on device 700; and/or d) superconducting lead 306b can be formed on device 700 as illustrated in FIGS. 8A and 8B (e.g., where a portion of superconducting lead 306b is formed on and overlaps a portion of superconducting lead 306a and insulator 310) by depositing superconducting material 304 through the one or more openings on the mask and onto sacrificial material 106, capacitor pad 206b, superconducting lead 306a, and/or insulator 310 at a second evaporation angle and a second evaporation direction that can each be defined with respect to top surfaces of device 700 depicted in FIG. 7A (e.g., top surfaces of sacrificial material 106 and capacitor pads 206a, 206b).

Superconducting leads 306a, 306b can be formed on device 700 as illustrated in FIGS. 8A and 8B, where each superconducting lead 306a, 306b can comprise various shapes and/or dimensions (e.g., width, length, thickness, etc.) that can depend on how superconducting material 304 is deposited on device 700 using the Niemeyer-Dolan technique described above (e.g., depending on the shape and/or dimensions of the mask and/or the one or more openings on the mask, depending on the first and second evaporation angles, depending on the first and second evaporation directions, etc.). All such various shapes and/or dimensions are contemplated within the scope of the illustrative embodiments of the subject disclosure. In some embodiments, superconducting leads 306a, 306b can comprise the same uniform width or different uniform widths (e.g., the same contiguous width or different contiguous widths with respect to each of superconducting leads 306a, 306b). For example, in one or more embodiments of the subject disclosure, superconducting lead 306a can comprise a uniform width that is greater than that of superconducting lead 306b, or vice versa. For instance, as described below and illustrated in the inset views depicted in FIGS. 12A and 13A, superconducting lead 306b can comprise a uniform width w and superconducting lead 306a can comprise a uniform width w+x, where x denotes a defined unit of distance (e.g., x nanometers (nm)).

It should be appreciated that superconducting material 304, superconducting leads 306a, 306b, and/or superconducting junction 312 can be indicative of hardmask component(s) that can protect and/or, in some embodiments, prevent removal of one or more portions of sacrificial material 106 and/or substrate 104 positioned under superconducting material 304, superconducting leads 306a, 306b, and/or superconducting junction 312 during one or more subsequent material removal processes (e.g., etching processes) that can be performed.

Figure 9A:
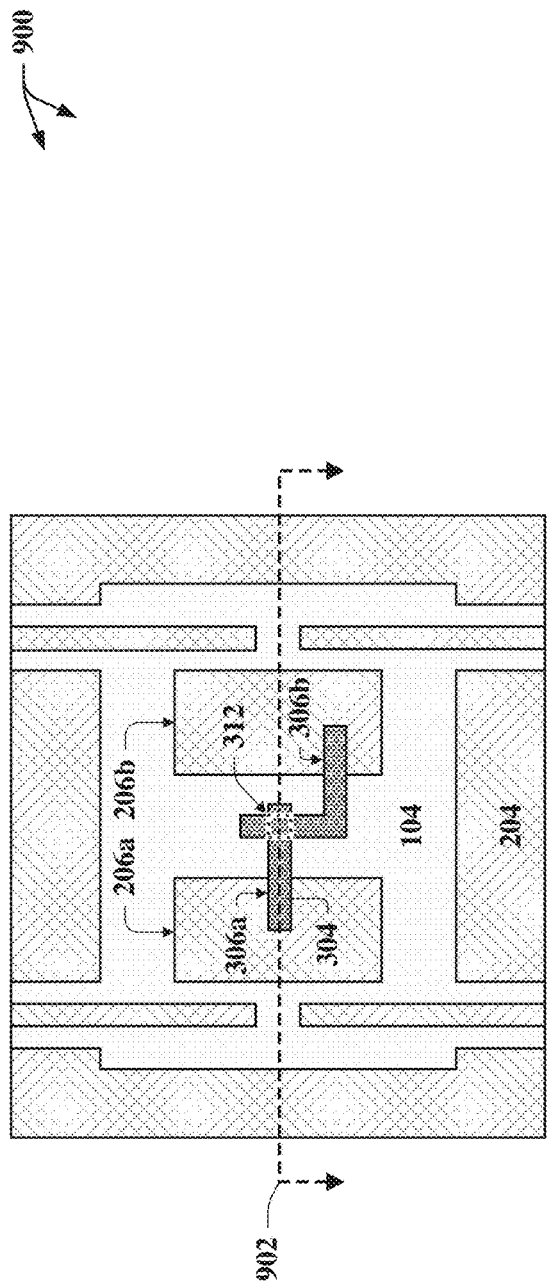
FIGS. 9A and 9B illustrate top and cross-sectional side views, respectively, of the example, non-limiting device of FIGS. 8A and 8B after removing one or more portions of the sacrificial layer from the device of FIGS. 8A and 8B in accordance with one or more embodiments described herein.
Figure 9B:
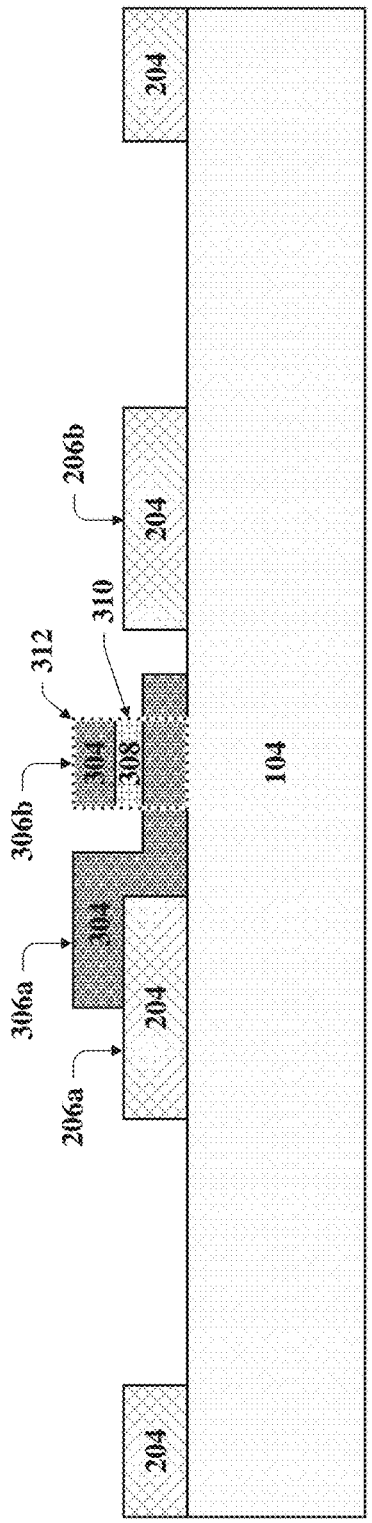

FIG. 9A illustrates a top view of the example, non-limiting device 800 of FIGS. 8A and 8B after removing one or more portions of the sacrificial layer from device 800 in accordance with one or more embodiments described herein. FIG. 9B illustrates a cross-sectional side view of device 900 as viewed along a plane defined by line 902. Repetitive description of like elements and/or processes employed in other embodiments described herein is omitted for sake of brevity.

Device 900 can comprise an example, non-limiting alternative embodiment of device 800 after removing one or more portions of sacrificial material 106 from device 800 as illustrated in the example embodiment depicted in FIGS. 9A and 9B. In this example embodiment, such one or more portions of sacrificial material 106 can be removed from device 800 using one or more etching techniques defined herein (e.g., CVP, RIE, dry etching, wet etching, ion beam etching, plasma etching, laser ablation, etc.) to yield device 900 depicted in FIGS. 9A and 9B. In some embodiments, such one or more portions of sacrificial material 106 can be removed from device 800 using a blanket etch technique with a differential etch chemistry. In the example embodiment illustrated in FIGS. 9A and 9B, all of sacrificial material 106 can be removed from device 800 to collapse portions of superconducting leads 306a, 306b, as well as insulator 310 and/or superconducting junction 312 onto substrate 104. In this example embodiment, device 900 can thereby provide a collapsed superconducting junction 312 on substrate 104, where such a collapsed superconducting junction 312 is also coupled to: superconducting leads 306a, 306b; and capacitor pads 206a, 206b.

As described above, sacrificial material 106 can protect substrate 104 from damage that can result during the example, non-limiting multi-step fabrication sequences described herein with reference to FIGS. 1A-13B that can be implemented to fabricate device 400, 900, 1000, 1100, and/or 1300. In some embodiments, removal of all of sacrificial material 106 from device 800 as described above and depicted in FIGS. 9A and 9B can comprise a final step in fabricating device 900. In these embodiments, removing all of sacrificial material 106 as a final step in the fabrication of device 900 can thereby enable device 900 to facilitate reduced energy loss and/or reduced two level system density at the interfaces between substrate 104 and at least one of: the collapsed portions of superconducting leads 306a, 306b; capacitor pads 206a, 206b; or air exposed to substrate 104.

Figure 10A:
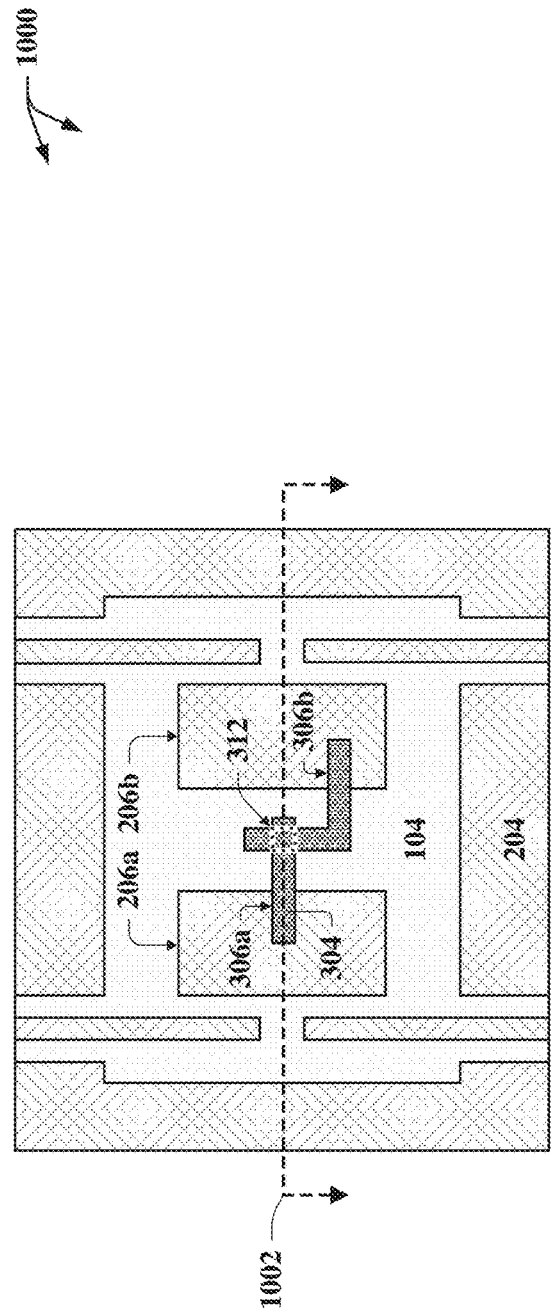
FIGS. 10A and 10B illustrate top and cross-sectional side views, respectively, of the example, non-limiting device of FIGS. 8A and 8B after removing one or more portions of the sacrificial layer from the device of FIGS. 8A and 8B in accordance with one or more embodiments described herein.
Figure 10B:
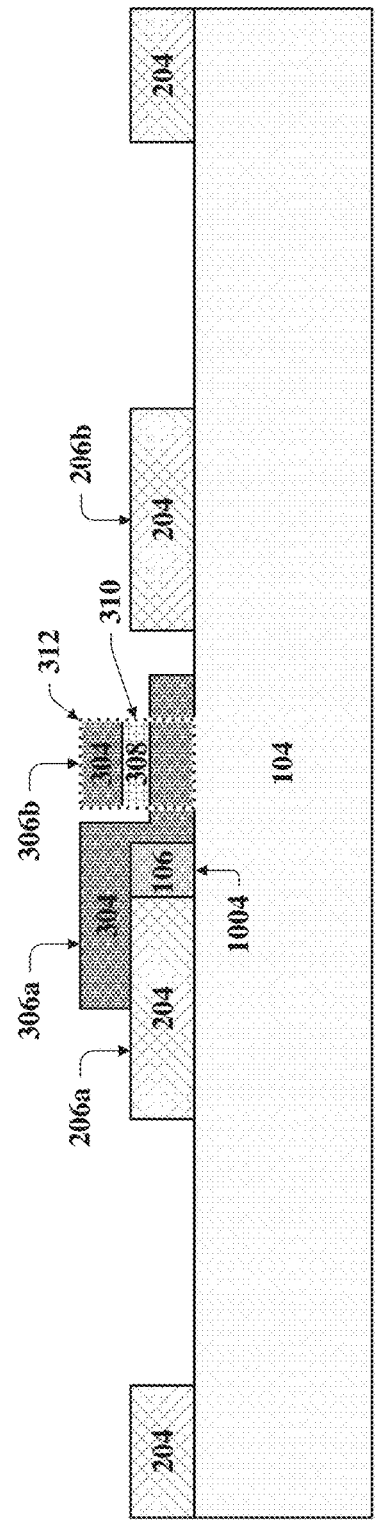

FIG. 10A illustrates a top view of the example, non-limiting device 800 of FIGS. 8A and 8B after removing one or more portions of the sacrificial layer from device 800 in accordance with one or more embodiments described herein. FIG. 10B illustrates a cross-sectional side view of device 1000 as viewed along a plane defined by line 1002. Repetitive description of like elements and/or processes employed in other embodiments described herein is omitted for sake of brevity.

Device 1000 can comprise an example, non-limiting alternative embodiment of device 800 after removing one or more portions of sacrificial material 106 from device 800 as illustrated in the example embodiment depicted in FIGS. 10A and 10B. In this example embodiment, such one or more portions of sacrificial material 106 can be removed from device 800 using one or more etching techniques defined herein (e.g., CVP, RIE, dry etching, wet etching, ion beam etching, plasma etching, laser ablation, etc.) to yield device 1000 depicted in FIGS. 10A and 10B. In some embodiments, such one or more portions of sacrificial material 106 can be removed from device 800 using a blanket etch technique with a differential etch chemistry.

In the example embodiment illustrated in FIGS. 10A and 10B, nearly all of sacrificial material 106 can be removed from device 800, while portions of sacrificial material 106 can remain to form pillars 1004 of sacrificial material 106 positioned under a portion of each of superconducting leads 306a, 306b (e.g., where one pillar 1004 that can remain under a portion of superconducting lead 306b is not illustrated in FIG. 10A or 10B). In this example embodiment, nearly all of sacrificial material 106 can be removed from device 800 to form pillars 1004 as described above and/or to collapse portions of superconducting leads 306a, 306b, as well as insulator 310 and/or superconducting junction 312 onto substrate 104. For example, the portions of superconducting leads 306a, 306b that are not supported by pillars 1004, as well as insulator 310 and/or superconducting junction 312, can collapse onto substrate 104 as illustrated in the example embodiment depicted in FIGS. 10A and 10B to yield device 1000. In this example, device 1000 can thereby provide a collapsed superconducting junction 312 on substrate 104, where such a collapsed superconducting junction 312 is also coupled to: superconducting leads 306a, 306b that are partially supported by pillars 1004; and capacitor pads 206a, 206b.

As described above, sacrificial material 106 can protect substrate 104 from damage that can result during the example, non-limiting multi-step fabrication sequences described herein with reference to FIGS. 1A-13B that can be implemented to fabricate device 400, 900, 1000, 1100, and/or 1300. In some embodiments, removal of nearly all of sacrificial material 106 from device 800 to form pillars 1004 and/or to collapse portions of superconducting leads 306a, 306b, as well as insulator 310 and/or superconducting junction 312 onto substrate 104 as described above and depicted in FIGS. 10A and 10B can comprise a final step in fabricating device 1000. In these embodiments, removing nearly all of sacrificial material 106 as a final step in the fabrication of device 1000 can thereby enable device 1000 to facilitate reduced energy loss and/or reduced two level system density at the interfaces between substrate 104 and at least one of: pillars 1004; the collapsed portions of superconducting leads 306a, 306b; capacitor pads 206a, 206b; or air exposed to substrate 104.

Figure 11A:
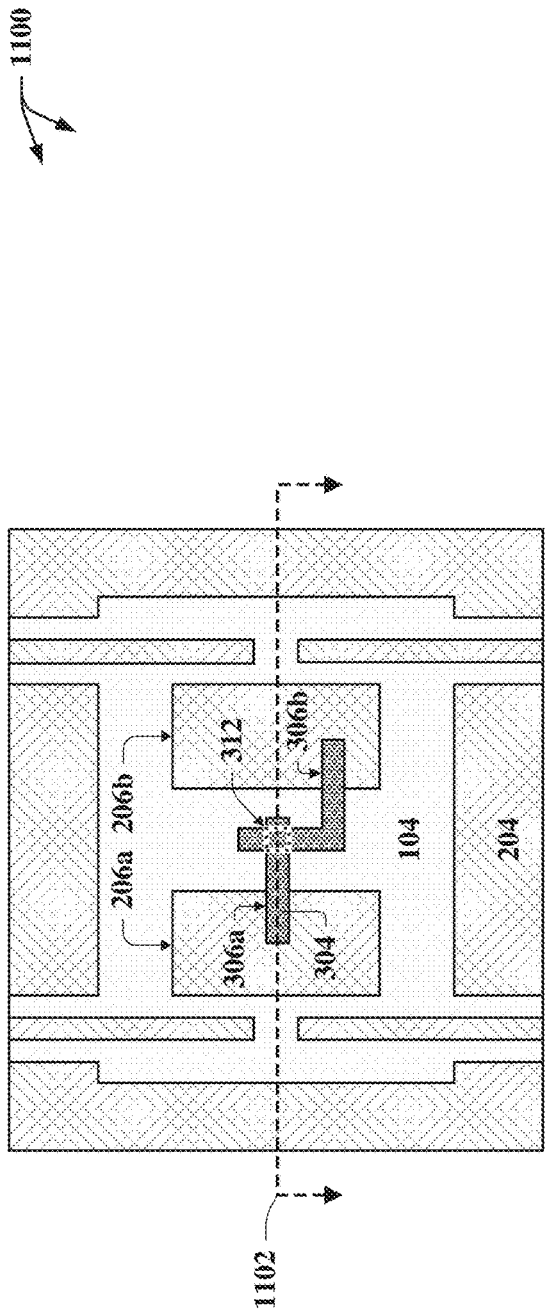
FIGS. 11A and 11B illustrate top and cross-sectional side views, respectively, of the example, non-limiting device of FIGS. 8A and 8B after removing one or more portions of the sacrificial layer from the device of FIGS. 8A and 8B in accordance with one or more embodiments described herein.
Figure 11B:
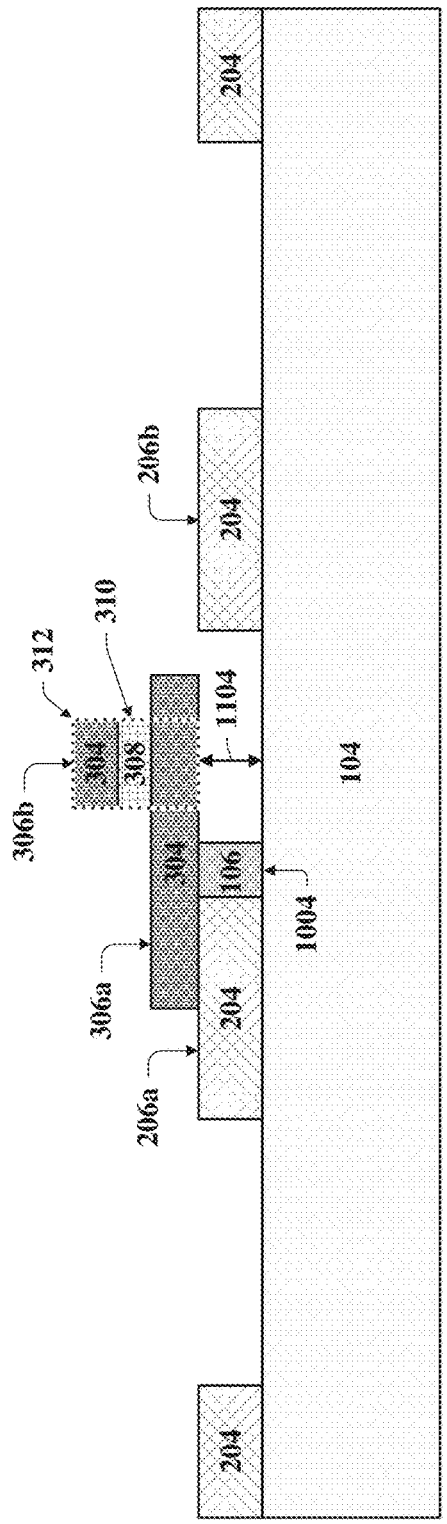

FIG. 11A illustrates a top view of the example, non-limiting device 800 of FIGS. 8A and 8B after removing one or more portions of the sacrificial layer from device 800 in accordance with one or more embodiments described herein. FIG. 11B illustrates a cross-sectional side view of device 1100 as viewed along a plane defined by line 1102. Repetitive description of like elements and/or processes employed in other embodiments described herein is omitted for sake of brevity.

Device 1100 can comprise an example, non-limiting alternative embodiment of device 800 after removing one or more portions of sacrificial material 106 from device 800 as illustrated in the example embodiment depicted in FIGS. 11A and 11B. In this example embodiment, such one or more portions of sacrificial material 106 can be removed from device 800 using one or more etching techniques defined herein (e.g., CVP, RIE, dry etching, wet etching, ion beam etching, plasma etching, laser ablation, etc.) to yield device 1100 depicted in FIGS. 11A and 11B. In some embodiments, such one or more portions of sacrificial material 106 can be removed from device 800 using a blanket etch technique with a differential etch chemistry. In some embodiments, based on such etching of sacrificial material 106 as described above, a critical point drying technique can be performed and/or a low surface tension drying liquid (e.g., isopropyl alcohol (IPA)) can be applied to dry device 1100.

In the example embodiment illustrated in FIGS. 11A and 11B, nearly all of sacrificial material 106 can be removed from device 800, while portions of sacrificial material 106 can remain to form pillars 1004 of sacrificial material 106 positioned under a portion of each of superconducting leads 306a, 306b (e.g., where one pillar 1004 that can remain under a portion of superconducting lead 306b is not illustrated in FIG. 11A or 11B). In this example embodiment, nearly all of sacrificial material 106 can be removed from device 800 to form pillars 1004 as described above and/or to suspend portions of superconducting leads 306a, 306b, as well as insulator 310 and superconducting junction 312 over substrate 104, thereby providing a gap 1104 between the bottom surfaces of the suspended sections of superconducting leads 306a, 306b and the top surface of substrate 104.

As described above, sacrificial material 106 can protect substrate 104 from damage that can result during the example, non-limiting multi-step fabrication sequences described herein with reference to FIGS. 1A-13B that can be implemented to fabricate device 400, 900, 1000, 1100, and/or 1300. In some embodiments, removal of nearly all of sacrificial material 106 from device 800 to form pillars 1004 and/or to suspend portions of superconducting leads 306a, 306b, as well as insulator 310 and/or superconducting junction 312 over substrate 104 as described above and depicted in FIGS. 11A and 11B can comprise a final step in fabricating device 1100. In these embodiments, removing nearly all of sacrificial material 106 as a final step in the fabrication of device 1100 can thereby enable device 1100 to facilitate reduced energy loss and/or reduced two level system density at the interfaces between substrate 104 and at least one of: pillars 1004; capacitor pads 206a, 206b; or air exposed to substrate 104.

Figure 12A:
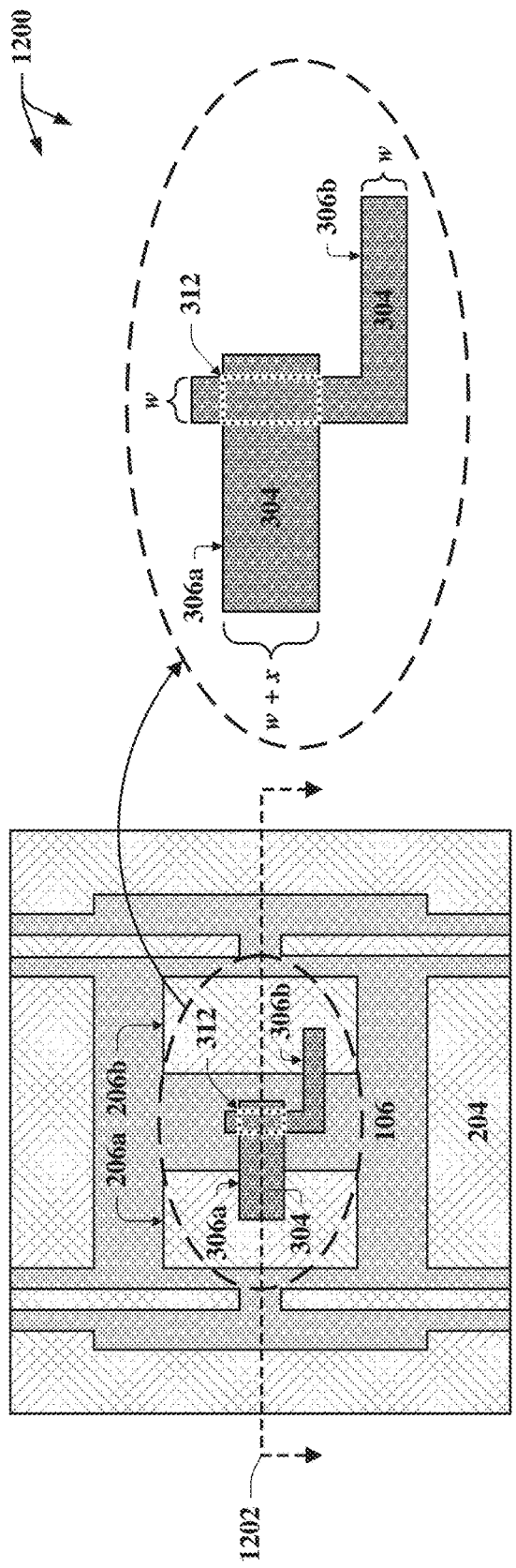
FIGS. 12A and 12B illustrate top and cross-sectional side views, respectively, of the example, non-limiting device of FIGS. 7A and 7B after formation of superconducting leads and a superconducting junction on the device of FIGS. 7A and 7B in accordance with one or more embodiments described herein.
Figure 12B:
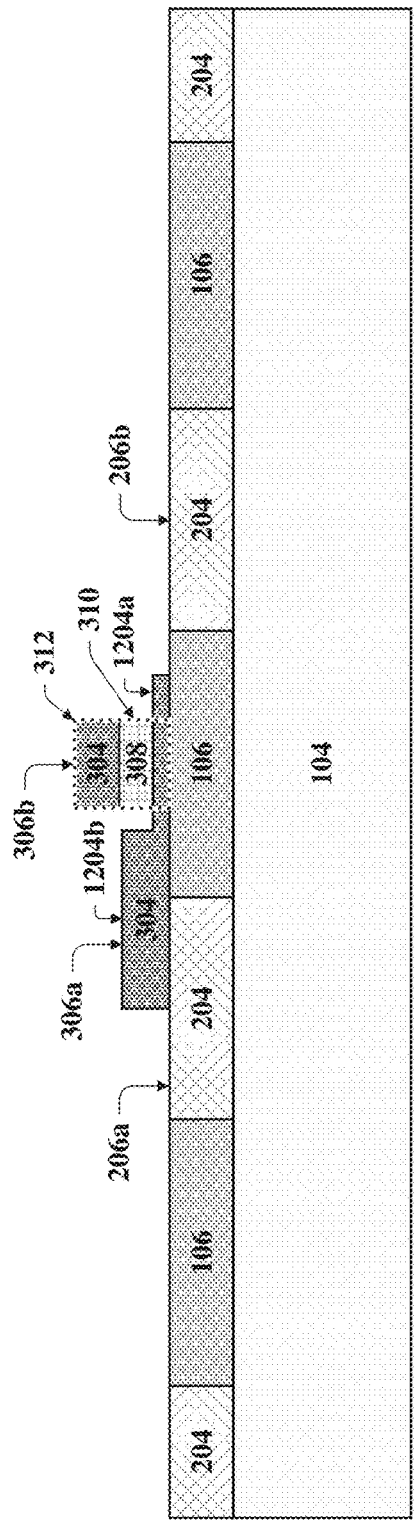

FIG. 12A illustrates a top view of the example, non-limiting device 700 of FIGS. 7A and 7B after formation of superconducting leads and a superconducting junction on device 700 in accordance with one or more embodiments described herein. FIG. 12B illustrates a cross-sectional side view of device 1200 as viewed along a plane defined by line 1202. Repetitive description of like elements and/or processes employed in other embodiments described herein is omitted for sake of brevity.

Device 1200 can comprise an example, non-limiting alternative embodiment of device 700 after depositing or growing superconducting material 304 described above with reference to FIGS. 3A and 3B on device 700 as illustrated in FIGS. 12A and 12B. For example, device 1200 can comprise an example, non-limiting alternative embodiment of device 700 after depositing or growing superconducting material 304 on capacitor pads 206a, 206b and sacrificial material 106 of device 700 to form superconducting leads 306a, 306b, insulating material 308, insulator 310, and superconducting junction 312 described above with reference to FIGS. 3A and 3B.

As illustrated in the example embodiment depicted in FIG. 12A, superconducting lead 306a can comprise a width (e.g., a uniform or contiguous width) that is greater than that of superconducting lead 306b. In this example embodiment, superconducting lead 306a can comprise a width (e.g., as defined along an axis of device 1200 that extends vertically across FIG. 12A) ranging from approximately 50 nm to approximately 5 μm. As illustrated in the example embodiment depicted in FIG. 12B, superconducting lead 306a of device 1200 can further comprise a first thickness section 1204a and a second thickness section 1204b, where second thickness section 1204b can comprise a thickness that is greater than that of first thickness section 1204a. In this example embodiment, insulating material 308, insulator 310, and/or superconducting junction 312 can be formed on first thickness section 1204a of superconducting lead 306a. In this example embodiment, first thickness section 1204a can comprise a thickness (e.g., a height defined along an axis of device 1200 that extends vertically across FIG. 12B) ranging from approximately 1 nm to approximately 50 nm and/or second thickness section 1204b can comprise a thickness (e.g., a height defined along an axis of device 1200 that extends vertically across FIG. 12B) ranging from approximately 10 nm to approximately 100 nm.

Superconducting leads 306a, 306b, insulator 310, and/or superconducting junction 312 can be formed on device 700 as illustrated in FIGS. 12A and 12B using one or more material deposition techniques, photolithography techniques, etching techniques, polishing techniques, and/or cleaning techniques defined above (e.g., a lithographic patterning process, epitaxial deposition, LPCVD, RTCVD, CVD, ALD, PVD, MBE, ECD, CVE, RIE, dry etching, wet etching, ion beam etching, plasma etching, laser ablation, material lift off (e.g., washing with a solvent, stripping, etc.), CMP, backgrinding, etc.). For example, superconducting leads 306a, 306b, insulator 310, and/or superconducting junction 312 can be formed on device 700 as illustrated in FIGS. 12A and 12B using the Niemeyer-Dolan technique, where:

a) an evaporation mask (not shown in the figures) can be formed using, for instance, two layers of photoresist such that the mask is suspended above device 700 and comprises one or more openings that enable deposition of superconducting material 304 onto device 700 at various angles with respect to the top surfaces of device 700 depicted in FIG. 7A (e.g., various evaporation angles with respect to top surfaces of sacrificial material 106 and capacitor pads 206a, 206b), where such one or more openings are shaped and/or positioned on the mask such that they further enable formation of superconducting lead 306a comprising first thickness section 1204a, second thickness section 1204b, and a width that is greater than that of superconducting lead 306b;

b) superconducting lead 306a can be formed on device 700 as illustrated in FIGS. 12A and 12B (e.g., superconducting lead 306a can be formed such that it comprises first thickness section 1204a, second thickness section 1204b, and a width that is greater than that of superconducting lead 306b) by depositing superconducting material 304 through such one or more openings on the mask and onto sacrificial material 106 and capacitor pad 206a at a first evaporation angle and a first evaporation direction that can each be defined with respect to the top surfaces of device 700 depicted in FIG. 7A (e.g., top surfaces of sacrificial material 106 and capacitor pads 206a, 206b);

c) insulator 310 can be formed on first thickness section 1204a of superconducting lead 306a by exposing a relatively small amount of ambient (e.g., atmosphere, air, etc.) to superconducting material 304 and/or first thickness section 1204a of superconducting lead 306a prior to forming superconducting lead 306b on device 700; and/or d) superconducting lead 306b can be formed on device 700 as illustrated in FIGS. 12A and 12B (e.g., where a portion of superconducting lead 306b is formed on and overlaps first thickness section 1204a of superconducting lead 306a and insulator 310) by depositing superconducting material 304 through the one or more openings on the mask and onto sacrificial material 106, capacitor pad 206b, first thickness section 1204a of superconducting lead 306a, and/or insulator 310 at a second evaporation angle and a second evaporation direction that can each be defined with respect to top surfaces of device 700 depicted in FIG. 7A (e.g., top surfaces of sacrificial material 106 and capacitor pads 206a, 206b).

Superconducting leads 306a, 306b can be formed on device 700 as illustrated in FIGS. 12A and 12B, where each superconducting lead 306a, 306b can comprise various shapes and/or dimensions (e.g., width, length, thickness, etc.) that can depend on how superconducting material 304 is deposited on device 700 using the Niemeyer-Dolan technique described above (e.g., depending on the shape and/or dimensions of the mask and/or the one or more openings on the mask, depending on the first and second evaporation angles, depending on the first and second evaporation directions, etc.). All such various shapes and/or dimensions are contemplated within the scope of the illustrative embodiments of the subject disclosure. As illustrated in the example embodiments depicted in FIGS. 12A and 12B, superconducting lead 306a can comprise a uniform width that is greater than that of superconducting lead 306b. For example, as illustrated in the inset view depicted in FIG. 12A, superconducting lead 306b can comprise a uniform width w and superconducting lead 306a can comprise a uniform width w+x, where x denotes a defined unit of distance (e.g., x nanometers (nm)).

It should be appreciated that superconducting material 304, superconducting leads 306a, 306b, and/or superconducting junction 312 can be indicative of hardmask component(s) that can protect and/or, in some embodiments, prevent removal of one or more portions of sacrificial material 106 and/or substrate 104 positioned under superconducting material 304, superconducting leads 306a, 306b, and/or superconducting junction 312 during one or more subsequent material removal processes (e.g., etching processes) that can be performed.

FIG. 13A illustrates a top view of the example, non-limiting device 1200 of FIGS. 12A and 12B after removing one or more portions of the sacrificial layer from device 1200 in accordance with one or more embodiments described herein. FIG. 13B illustrates a cross-sectional side view of device 1300 as viewed along a plane defined by line 1302. Repetitive description of like elements and/or processes employed in other embodiments described herein is omitted for sake of brevity.

Device 1300 can comprise an example, non-limiting alternative embodiment of device 1200 after removing one or more portions of sacrificial material 106 from device 1200 as illustrated in the example embodiment depicted in FIGS. 13A and 13B. In this example embodiment, such one or more portions of sacrificial material 106 can be removed from device 1200 using one or more etching techniques defined herein (e.g., CVP, RIE, dry etching, wet etching, ion beam etching, plasma etching, laser ablation, etc.) to yield device 1300 depicted in FIGS. 13A and 13B. In some embodiments, such one or more portions of sacrificial material 106 can be removed from device 1200 using a blanket etch technique with a differential etch chemistry.

In the example embodiment illustrated in FIGS. 13A and 13B, nearly all of sacrificial material 106 can be removed from device 1200, while portions of sacrificial material 106 can remain to form pillars 1304 of sacrificial material 106 positioned under a portion of each of superconducting leads 306a, 306b (e.g., where one pillar 1304 that can remain under a portion of superconducting lead 306b is not illustrated in FIG. 13A or 13B). In this example embodiment, based on such removal of sacrificial material 106 as described above, one of such pillars 1304 that can be positioned under superconducting lead 306a as illustrated in FIG. 13B can enable the portions of superconducting lead 306b that can overlap and/or extend past first thickness section 1204a of superconducting lead 306a to be suspended over substrate 104, thereby providing a gap 1306 between the bottom surfaces of such portions of superconducting lead 306b and the top surface of substrate 104.

As described above, sacrificial material 106 can protect substrate 104 from damage that can result during the example, non-limiting multi-step fabrication sequences described herein with reference to FIGS. 1A-13B that can be implemented to fabricate device 400, 900, 1000, 1100, and/or 1300. In some embodiments, removal of nearly all of sacrificial material 106 from device 1200 to form pillars 1304 and/or to suspend portions of superconducting lead 306b over substrate 104 as described above and depicted in FIGS. 13A and 13B can comprise a final step in fabricating device 1300. In these embodiments, removing nearly all of sacrificial material 106 as a final step in the fabrication of device 1300 can thereby enable device 1300 to facilitate reduced energy loss and/or reduced two level system density at the interfaces between substrate 104 and at least one of: pillars 1304; capacitor pads 206a, 206b; or air exposed to substrate 104.

In the example embodiment illustrated in FIGS. 13A and 13B, it should be appreciated that sacrificial material 106, material 204, and/or superconducting material 304 can be lattice ordered with respect to one or more material layers provided under such material layer(s). For example, superconducting material 304 can be lattice ordered with respect to sacrificial material 106 and/or material 204. In this example, sacrificial material 106 and/or material 204 can be lattice ordered with respect to substrate 104. Therefore, in this example: superconducting leads 306a, 306b can be lattice ordered with respect to capacitor pads 206a, 206b and/or pillars 1304; and/or capacitor pads 206a, 206b and/or pillars 1304 can be lattice ordered with respect to substrate 104. In some embodiments, superconducting lead 306a and/or first thickness section 1204a of superconducting lead 306a can be lattice ordered with respect to pillar 1304 provided under first thickness section 1204a of superconducting lead 306a, where such a pillar 1304 can be lattice ordered with respect to substrate 104. In these embodiments, as superconducting junction 312 of device 1300 can comprise a Josephson junction, superconducting junction 312 can therefore comprise a lattice ordered Josephson junction.

To provide such lattice ordered materials and/or components of device 1300 as described above, one or more of such materials and/or components can be epitaxially formed. In some embodiments, sacrificial material 106, material 204, and/or superconducting material 304 can be grown to yield device 1300 by using an epitaxial film growth process performed in an epitaxial growth furnace (e.g., via epitaxial deposition, LPCVD, RTCVD, etc.). For example, sacrificial material 106, material 204, and/or superconducting material 304 can be grown separately in separate fabrication phases or grown together in situ during the same fabrication phase (e.g., in situ epitaxial film growth performed in an epitaxial growth furnace via, for instance, LPCVD, RTCVD, etc.).

Utilizing such an in situ epitaxial film growth process to grow sacrificial material 106, material 204, and/or superconducting material 304 in such a manner can facilitate desirable crystallinity of each layer (film), thereby enabling such lattice ordered materials and/or components of device 1300 as described above. Utilizing such an in situ epitaxial film growth process to grow sacrificial material 106, material 204, and/or superconducting material 304 in such a manner can further prevent oxidation and/or defects at the interfaces between such materials and/or at the interfaces between one or more of such materials and another material on device 1300. Utilizing such an in situ epitaxial film growth process to grow sacrificial material 106, material 204, and/or superconducting material 304 in such a manner can further facilitate repeatable fabrication of each of such layers to a desirable dimension (e.g., width, length, thickness, etc.). Such repeatable fabrication of each of such layers to a desirable dimension (e.g., width, length, thickness, etc.) can facilitate: improved consistency of the desirable dimension in a plurality of qubit devices (e.g., a plurality of devices 400, 900, 1000, 1100, and/or 1300) fabricated using such an in situ epitaxial film growth process; and/or improved coherence time, improved performance, and/or improved lifespan of such a qubit device fabricated using such an in situ epitaxial film growth process.

In some embodiments, one or more superconducting properties of superconducting material 304 can be changed by proximity effect or by diffusion. Therefore, in these embodiments, one or more superconducting properties of superconducting lead 306a and/or first thickness section 1204a of superconducting lead 306a can be changed by proximity effect or by diffusion. In some embodiments, superconducting lead 306a and/or superconducting lead 306b can comprise aluminum (Al) and sacrificial material 106 can comprise niobium (Nb). In these embodiments, it should be appreciated that using aluminum (Al) to form superconducting lead 306a and/or first thickness section 1204a of superconducting lead 306a and using niobium (Nb) to form pillar 1304 provided under first thickness section 1204a of superconducting lead 306a can increase the critical temperature of superconducting junction 312 and/or device 1300. In these embodiments, based on such an increased critical temperature of superconducting junction 312 and/or device 1300, device 1300 can thereby facilitate reduced operational and/or computational costs associated with a quantum device (e.g., a quantum computing device, a quantum computer, a quantum processor, etc.) that can comprise device 1300.

Device 400, 900, 1000, 1100, and/or 1300 can be associated with various technologies. For example, device 400, 900, 1000, 1100, and/or 1300 can be associated with semiconductor and/or superconductor device technologies, semiconductor and/or superconductor device fabrication technologies, quantum computing device technologies, quantum computing device fabrication technologies, qubit device technologies, qubit device fabrication technologies, and/or other technologies.

Device 400, 900, 1000, 1100, and/or 1300 can provide technical improvements to the various technologies listed above. For example, device 400, 900, 1000, 1100, and/or 1300 can comprise a qubit device that can be implemented in a quantum computing device (e.g., a quantum processor, quantum computer, etc.) to facilitate improved quantum computing. For instance, as described above, sacrificial material 106 can comprise a low interface loss superconducting material (e.g., niobium (Nb), titanium (Ti), molybdenum (Mo), niobium nitride (NbN), titanium nitride (TiN), molybdenum nitride (MoN), niobium titanium nitride (NbTiN), etc.). In this example, sacrificial material 106 can protect substrate 104 from damage that can result during the example, non-limiting multi-step fabrication sequences described herein with reference to FIGS. 1A-13B that can be implemented to fabricate device 400, 900, 1000, 1100, and/or 1300. In this example, removing one or more portions of sacrificial material 106 can comprise a final step in fabricating device 400, 900, 1000, 1100, and/or 1300, which can thereby enable such devices to facilitate reduced energy loss and/or reduced two level system density at the interfaces between substrate 104 and at least one of: sacrificial material 106; material 204; capacitor pads 206a, 206b; superconducting material 304; superconducting leads 306a, 306b; pillars 1004; pillars 1304; or air exposed to substrate 104. In this example, by providing such one or more interfaces of reduced energy loss and/or reduced two level system density, device 400, 900, 1000, 1100, and/or 1300 can thereby facilitate reduced energy loss by such devices, improved performance of such devices (e.g., reduced error rates, improved accuracy, etc.), and/or improved fidelity of such devices.

Device 400, 900, 1000, 1100, and/or 1300 can provide technical improvements to a processing unit associated with and/or comprising device 400, 900, 1000, 1100, and/or 1300. For example, as described above, by providing such one or more interfaces of reduced energy loss and/or reduced two level system density, device 400, 900, 1000, 1100, and/or 1300 can thereby facilitate reduced energy loss by such devices, improved performance of such devices (e.g., reduced error rates, improved accuracy, etc.), and/or improved fidelity of such devices. In this example, device 400, 900, 1000, 1100, and/or 1300 can thereby enable improved performance, accuracy, and/or fidelity of a quantum computing device comprising device 400, 900, 1000, 1100, and/or 1300. In this example, such a quantum computing device can comprise a processing unit such as, for example, a quantum processor comprising one or more of device 400, 900, 1000, 1100, and/or 1300. Such improvement(s) to such a processing unit can further facilitate improved efficiency of the processing unit, as well as reduced computational costs of the processing unit.

A practical application of device 400, 900, 1000, 1100, and/or 1300 is that they can be implemented in a quantum computing device (e.g., a quantum processor, a quantum computer, etc.) to improve processing fidelity, processing performance, and/or processing costs of such a quantum computing device, which can facilitate fast and/or possibly universal quantum computing. Such a practical application can improve the output (e.g., computation and/or processing results) of one or more compilation jobs (e.g., quantum computing jobs) that are executed on such a device. In an example, a practical application of device 400, 900, 1000, 1100, and/or 1300 is that it can be implemented in a quantum computing device (e.g., a quantum processor, a quantum computer, etc.) that can be used to compute one or more solutions (e.g., heuristic(s), etc.) to a variety of problems ranging in complexity (e.g., an estimation problem, an optimization problem, etc.) in a variety of domains (e.g., finance, chemistry, medicine, etc.). For instance, a practical application of device 400, 900, 1000, 1100, and/or 1300 is that it can be implemented in such a quantum computing device that can be used to compute one or more solutions (e.g., heuristic(s), etc.) to an optimization problem in the domain of chemistry, medicine, and/or finance, where such a solution can be used to engineer, for instance, a new chemical compound, a new medication, and/or a new option premium model.

It should be appreciated that device 400, 900, 1000, 1100, and/or 1300 provides a new approach for facilitating reduced energy losses at one or more interfaces in a qubit device and/or protection of a substrate in a qubit device using sacrificial material that is driven by relatively new quantum computing technologies. It should also be appreciated that device 400, 900, 1000, 1100, and/or 1300 provides a new approach for fabricating such a qubit device that is driven by relatively new quantum computing technologies. For example, device 400, 900, 1000, 1100, and/or 1300 provides a new approach for using sacrificial material 106 (e.g., a low interface loss superconducting material) to protect substrate 104 and to provide one or more interfaces of reduced energy loss and/or reduced two level system density, thereby facilitating reduced energy loss associated with device 400, 900, 1000, 1100, and/or 1300.

Device 400, 900, 1000, 1100, and/or 1300 can be coupled to hardware and/or software to solve problems that are highly technical in nature, that are not abstract and that cannot be performed as a set of mental acts by a human. For example, device 400, 900, 1000, 1100, and/or 1300 can be implemented in a quantum computing device that can process information and/or execute calculations that are not abstract and that cannot be performed as a set of mental acts by a human.

It should be appreciated that device 400, 900, 1000, 1100, and/or 1300 can utilize various combinations of electrical components, mechanical components, and circuitry that cannot be replicated in the mind of a human or performed by a human. For example, facilitating quantum computing is an operation that is greater than the capability of a human mind. For instance, the amount of data processed, the speed of processing such data, and/or the types of data processed over a certain period of time by such a quantum computing device comprising and/or utilizing device 400, 900, 1000, 1100, and/or 1300 can be greater, faster, and/or different than the amount, speed, and/or data type that can be processed by a human mind over the same period of time.

Device 400, 900, 1000, 1100, and/or 1300 can also be fully operational towards performing one or more other functions (e.g., fully powered on, fully executed, etc.) while also performing the above-referenced operations. It should also be appreciated that such simultaneous multi-operational execution is beyond the capability of a human mind. It should also be appreciated that device 400, 900, 1000, 1100, and/or 1300 can include information that is impossible to obtain manually by an entity, such as a human user. For example, the type, amount, and/or variety of information included in and/or processed by device 400, 900, 1000, 1100, and/or 1300 can be more complex than information obtained manually by a human user.

Figure 14:
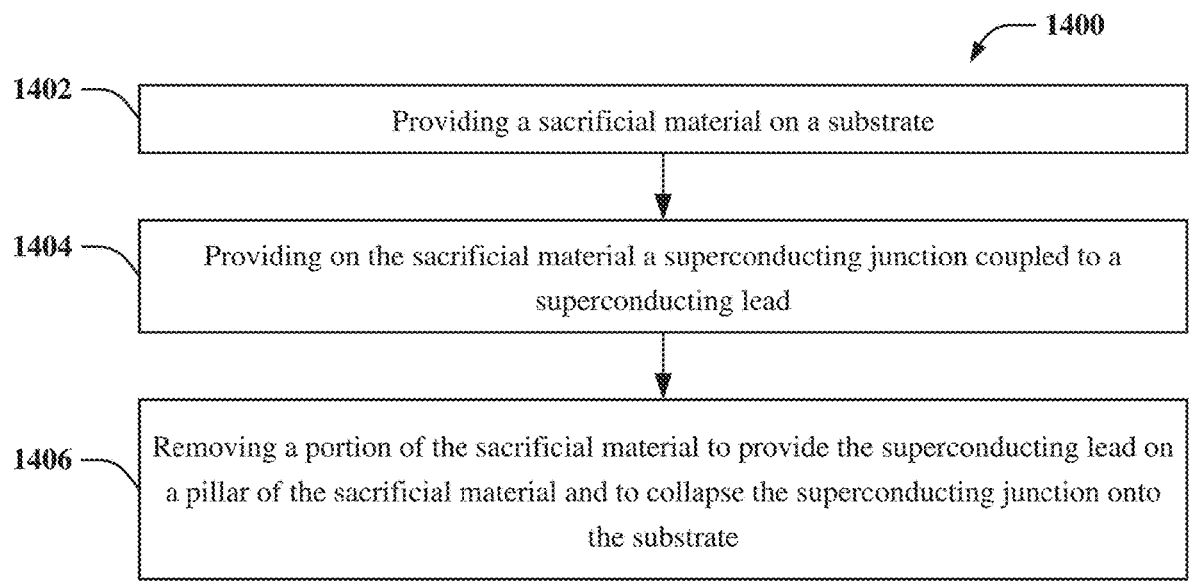
FIGS. 14 and 15 illustrate flow diagrams of example, non-limiting methods that can facilitate protection of a substrate in a qubit device using sacrificial material in accordance with one or more embodiments described herein.

FIG. 14 illustrates a flow diagram of an example, non-limiting method 1400 that can facilitate protection of a substrate in a qubit device using sacrificial material in accordance with one or more embodiments described herein. Repetitive description of like elements and/or processes employed in other embodiments described herein is omitted for sake of brevity.

At 1402, method 1400 can comprise providing (e.g., via computer 1612) a sacrificial material (e.g., sacrificial material 106) on a substrate (e.g., substrate 104).

At 1404, method 1400 can comprise providing (e.g., via computer 1612) on the sacrificial material a superconducting junction (e.g., superconducting junction 312) coupled to a superconducting lead (e.g., coupled to superconducting lead 306*a* and/or superconducting lead 306*b* via the formation of superconducting leads 306*a*, 306*b*, insulator 310, and superconducting junction 312 as described above with reference to FIGS. 3A, 3B, 8A, 8B, 12A, and 12B).

At 1406, method 1400 can comprise removing (e.g., via computer 1612) a portion (e.g., substantially all or most) of the sacrificial material to provide the superconducting lead on a pillar (e.g., pillar 1004) of the sacrificial material and to collapse the superconducting junction onto the substrate (e.g., thereby providing a collapsed superconducting junction 312 on substrate 104 as described above and illustrated in FIGS. 10A and 10B).

Figure 15:
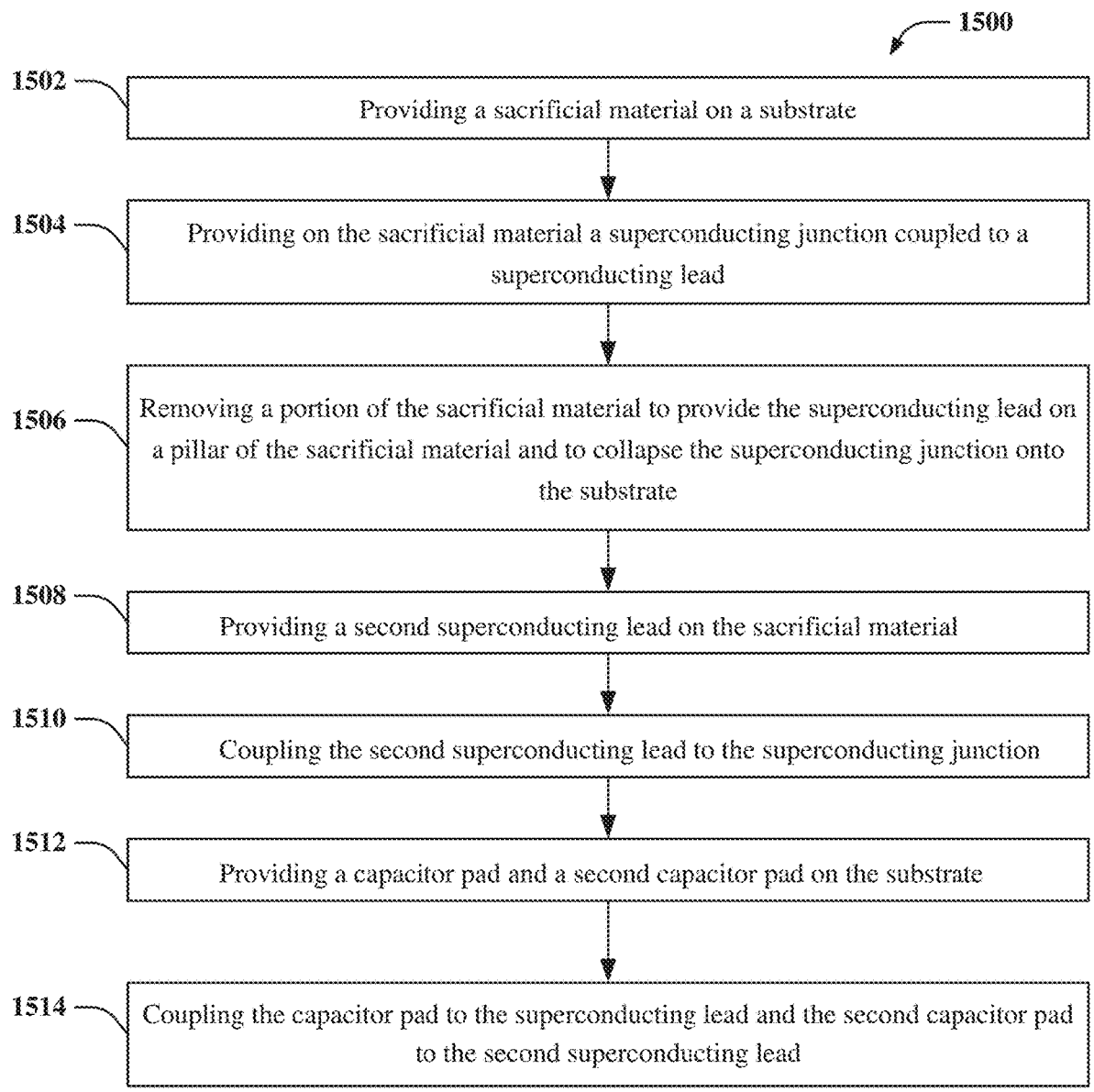

FIG. 15 illustrates a flow diagram of an example, non-limiting method 1500 that can facilitate protection of a substrate in a qubit device using sacrificial material in accordance with one or more embodiments described herein. Repetitive description of like elements and/or processes employed in other embodiments described herein is omitted for sake of brevity.

At 1502, method 1500 can comprise providing (e.g., via computer 1612) a sacrificial material (e.g., sacrificial material 106) on a substrate (e.g., substrate 104).

At 1504, method 1500 can comprise providing (e.g., via computer 1612) on the sacrificial material a superconducting junction (e.g., superconducting junction 312) coupled to a superconducting lead (e.g., coupled to superconducting lead 306*a* and/or superconducting lead 306*b* via the formation of superconducting leads 306*a*, 306*b*, insulator 310, and superconducting junction 312 as described above with reference to FIGS. 3A, 3B, 8A, 8B, 12A, and 12B).

At 1506, method 1500 can comprise removing (e.g., via computer 1612) a portion (e.g., substantially all or most) of the sacrificial material to provide the superconducting lead on a pillar (e.g., pillar 1004) of the sacrificial material and to collapse the superconducting junction onto the substrate (e.g., thereby providing a collapsed superconducting junction 312 on substrate 104 as described above and illustrated in FIGS. 10A and 10B).

At 1508, method 1500 can comprise providing (e.g., via computer 1612) a second superconducting lead (e.g., superconducting lead 306*b*) on the sacrificial material.

At 1510, method 1500 can comprise coupling (e.g., via computer 1612) the second superconducting lead to the superconducting junction (e.g., coupling superconducting lead 306*b* to superconducting junction 312 via the formation of superconducting leads 306*a*, 306*b*, insulator 310, and superconducting junction 312 as described above with reference to FIGS. 3A, 3B, 8A, 8B, 12A, and 12B).

At 1512, method 1500 can comprise providing (e.g., via computer 1612) a capacitor pad (e.g., capacitor pad 206*a*) and a second capacitor pad (e.g., capacitor pad 206*b*) on the substrate.

At 1514, method 1500 can comprise coupling (e.g., via computer 1612) coupling the capacitor pad to the superconducting lead and the second capacitor pad to the second superconducting lead (e.g., superconducting leads 306a, 306b can be coupled to capacitor pads 206a, 206b, respectively, via the formation of superconducting leads 306a, 306b on capacitor pads 206a, 206b as described above with reference to FIGS. 3A, 3B, 8A, 8B, 12A, and 12B).

The example, non-limiting multi-step fabrication sequences described above with reference to FIGS. 1A-13B and/or the operations of methods 1400, 1500 described above, which can be implemented to fabricate one or more embodiments of the subject disclosure described herein and/or illustrated in the figures, can be implemented by a computing system (e.g., operating environment 1600 illustrated in FIG. 16 and described below) and/or a computing device (e.g., computer 1612 illustrated in FIG. 16 and described below). In non-limiting example embodiments, such computing system (e.g., operating environment 1600) and/or such computing device (e.g., computer 1612) can comprise one or more processors and one or more memory devices that can store executable instructions thereon that, when executed by the one or more processors, can facilitate performance of the example, non-limiting multi-step fabrication operations described herein with reference to FIGS. 1A-13B and/or the operations of methods 1400, 1500 described above with reference to FIGS. 14 and 15, respectively. As a non-limiting example, the one or more processors can facilitate performance of the example, non-limiting multi-step fabrication operations described herein with reference to FIGS. 1A-13B and/or the operations of methods 1400, 1500 described above by directing and/or controlling one or more systems and/or equipment operable to perform semiconductor and/or superconductor device fabrication.

For simplicity of explanation, the methodologies described herein (e.g., computer-implemented methodologies) are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies described herein (e.g., computer-implemented methodologies) in accordance with the disclosed subject matter. In addition, those skilled in the art will understand and appreciate that such methodologies could alternatively be represented as a series of interrelated states via a state diagram or events. Additionally, it should be further appreciated that the methodologies (e.g., computer-implemented methodologies) disclosed hereinafter and throughout this specification are capable of being stored on an article of manufacture to facilitate transporting and transferring such methodologies (e.g., computer-implemented methodologies) to computers. The term article of manufacture, as used herein, is intended to encompass a computer program accessible from any computer-readable device or storage media.

Figure 16:
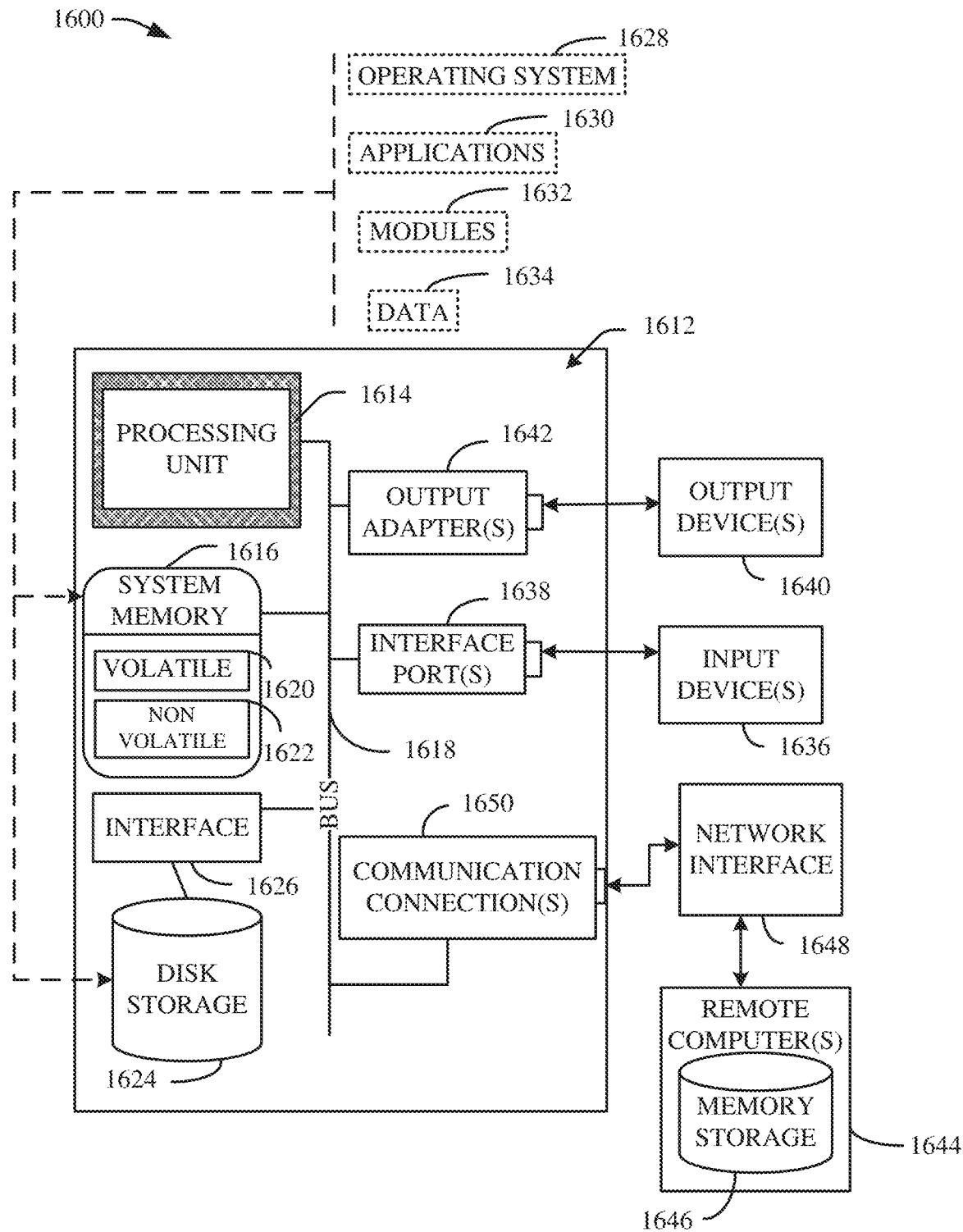
FIG. 16 illustrates a block diagram of an example, non-limiting operating environment in which one or more embodiments described herein can be facilitated.

In order to provide a context for the various aspects of the disclosed subject matter, FIG. 16 as well as the following discussion are intended to provide a general description of a suitable environment in which the various aspects of the disclosed subject matter can be implemented. FIG. 16 illustrates a block diagram of an example, non-limiting operating environment in which one or more embodiments described herein can be facilitated. For example, operating environment 1600 can be used to implement the example, non-limiting multi-step fabrication operations described herein with reference to FIGS. 1A-13B and/or the operations of methods 1400, 1500 described above with reference to FIGS. 14 and 15, respectively, which can facilitate implementation of one or more embodiments of the subject disclosure described herein. Repetitive description of like elements and/or processes employed in other embodiments described herein is omitted for sake of brevity.

With reference to FIG. 16, a suitable operating environment 1600 for implementing various aspects of this disclosure can also include a computer 1612. The computer 1612 can also include a processing unit 1614, a system memory 1616, and a system bus 1618. The system bus 1618 couples system components including, but not limited to, the system memory 1616 to the processing unit 1614. The processing unit 1614 can be any of various available processors. Dual microprocessors and other multiprocessor architectures also can be employed as the processing unit 1614. The system bus 1618 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1616 can also include volatile memory 1620 and nonvolatile memory 1622. The basic input/output system (BIOS), containing the basic routines to transfer information between elements within the computer 1612, such as during start-up, is stored in nonvolatile memory 1622. Computer 1612 can also include removable/non-removable, volatile/non-volatile computer storage media. FIG. 16 illustrates, for example, a disk storage 1624. Disk storage 1624 can also include, but is not limited to, devices like a magnetic disk drive, floppy disk drive, tape drive, Jaz drive, Zip drive, LS-100 drive, flash memory card, or memory stick. The disk storage 1624 also can include storage media separately or in combination with other storage media. To facilitate connection of the disk storage 1624 to the system bus 1618, a removable or non-removable interface is typically used, such as interface 1626. FIG. 16 also depicts software that acts as an intermediary between users and the basic computer resources described in the suitable operating environment 1600. Such software can also include, for example, an operating system 1628. Operating system 1628, which can be stored on disk storage 1624, acts to control and allocate resources of the computer 1612.

System applications 1630 take advantage of the management of resources by operating system 1628 through program modules 1632 and program data 1634, e.g., stored either in system memory 1616 or on disk storage 1624. It is to be appreciated that this disclosure can be implemented with various operating systems or combinations of operating systems. A user enters commands or information into the computer 1612 through input device(s) 1636. Input devices 1636 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1614 through the system bus 1618 via interface port(s) 1638. Interface port(s) 1638 include, for example, a serial port, a parallel port, a game port, and a universal serial bus (USB). Output device(s) 1640 use some of the same type of ports as input device(s) 1636. Thus, for example, a USB port can be used to provide input to computer 1612, and to output information from computer 1612 to an output device 1640. Output adapter 1642 is provided to illustrate that there are some output devices 1640 like monitors, speakers, and printers, among other output devices 1640, which require special adapters. The output adapters 1642 include, by way of illustration and not limitation, video and sound cards that provide a means of connection between the output device 1640 and the system bus 1618. It should be noted that other devices and/or systems of devices provide both input and output capabilities such as remote computer(s) 1644.

Computer 1612 can operate in a networked environment using logical connections to one or more remote computers, such as remote computer(s) 1644. The remote computer(s) 1644 can be a computer, a server, a router, a network PC, a workstation, a microprocessor based appliance, a peer device or other common network node and the like, and typically can also include many or all of the elements described relative to computer 1612. For purposes of brevity, only a memory storage device 1646 is illustrated with remote computer(s) 1644. Remote computer(s) 1644 is logically connected to computer 1612 through a network interface 1648 and then physically connected via communication connection 1650. Network interface 1648 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1650 refers to the hardware/software employed to connect the network interface 1648 to the system bus 1618. While communication connection 1650 is shown for illustrative clarity inside computer 1612, it can also be external to computer 1612. The hardware/software for connection to the network interface 1648 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible.

Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
    a first superconducting lead, wherein a bottom surface of the first superconducting lead is in contact with a top surface a first capacitor pad;
    a second superconducting lead, wherein a bottom surface of the second superconducting lead is in contact with a top surface on a second capacitor pad, wherein the first capacitor pad and the second capacitor pad are superconducting; and
    a superconducting junction formed from the first superconducting lead and the second superconducting lead, wherein the superconducting junction forms an electrical connection between the top surface of the first capacitor pad and the top surface of the second capacitor pad.

2. The device of claim 1, wherein the superconducting junction is selected from a group consisting of a Josephson junction and a superconducting Josephson junction.

3. The device of claim 1, wherein the superconducting junction extends above the first capacitor pad.

4. The device of claim 1, wherein a second material is located between a portion of the first superconducting lead and a substrate.

5. The device of claim 4, wherein the second material comprises a material that can serve as a quasiparticle trap.

6. The device of claim 4, wherein the second material comprises a dielectric material.

7. The device of claim 1, wherein a bottom surface of the superconducting junction is in contact with a substrate.

8. The device of claim 1, wherein a bottom surface of the superconducting junction is separated from a substrate.

9. The device of claim 1, wherein a second material is located beneath the first capacitor pad.

* * * * *